United States Patent
Nakamura et al.

(10) Patent No.: US 8,865,395 B2
(45) Date of Patent: Oct. 21, 2014

(54) METHOD OF FORMING RESIST PATTERN

(75) Inventors: Tsuyoshi Nakamura, Kawasaki (JP);
Kiyoshi Ishikawa, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 79 days.

(21) Appl. No.: 13/489,862

(22) Filed: Jun. 6, 2012

(65) Prior Publication Data

US 2013/0017501 A1    Jan. 17, 2013

(30) Foreign Application Priority Data

Jun. 10, 2011    (JP) .................. 2011-130453

(51) Int. Cl.
*G03F 7/40*    (2006.01)
*G03F 7/039*    (2006.01)
*G03F 7/32*    (2006.01)
*H01L 21/027*    (2006.01)

(52) U.S. Cl.
CPC .......... *H01L 21/0273* (2013.01); *G03F 7/0397* (2013.01); *G03F 7/325* (2013.01); *G03F 7/405* (2013.01)
USPC ............................ 430/324; 430/325; 430/330

(58) Field of Classification Search
USPC ................... 430/322, 324, 325, 330
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 2005/0123851 A1 * | 6/2005 | Shinbori et al. | 430/270.1 |
| 2006/0099347 A1 * | 5/2006 | Sugeta et al. | 427/372.2 |
| 2009/0317743 A1 | 12/2009 | Shiono et al. | |
| 2010/0305248 A1 * | 12/2010 | Kozawa et al. | 524/104 |
| 2010/0311244 A1 * | 12/2010 | Hu et al. | 438/703 |

FOREIGN PATENT DOCUMENTS

| | | |
|---|---|---|
| JP | A-01-307228 | 12/1989 |
| JP | A-04-364021 | 12/1992 |
| JP | A-09-208554 | 8/1997 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2002-090991 | 3/2002 |
| JP | A-2009-025723 | 2/2009 |
| JP | A-2010-002870 | 1/2010 |
| JP | B-4657883 | 3/2011 |
| WO | WO 2004/074242 A2 | 9/2004 |

* cited by examiner

*Primary Examiner* — Kathleen Duda
(74) *Attorney, Agent, or Firm* — Knobbe Martens Olson & Bear LLP

(57) ABSTRACT

A method of forming a resist pattern, comprising: a step of forming a resist film on a substrate using a resist composition containing a base component (A) which exhibits decreased solubility in an organic solvent under action of acid and an acid-generator component (B) which generates acid upon exposure; a step of subjecting the resist film to exposure; a step of patterning the resist film by a negative-tone development using a developing solution containing the organic solvent to form a resist pattern; a step of applying a coating material to the resist pattern, thereby forming a coating film; a step of performing a thermal treatment at a temperature lower than the softening point of the resist pattern, thereby heat shrinking the coating film to narrow an interval between the resist pattern; and a step of removing the coating film.

4 Claims, No Drawings

METHOD OF FORMING RESIST PATTERN

TECHNICAL FIELD

The present invention relates to a method of forming a resist pattern which enables miniaturization of the pattern dimension and improvement in the uniformity of the pattern.

Priority is claimed on Japanese Patent Application No. 2011-130453, filed Jun. 10, 2011, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in a developing solution under the action of acid and an acid-generator component that generates acid upon exposure.

For example, in the case where the developing solution is an alkali developing solution (alkali developing process), a chemically amplified positive resist which contains, as a base component (base resin), a resin which exhibits increased solubility in an alkali developing solution under action of acid, and an acid generator is typically used. If the resist film formed using the resist composition is selectively exposed during formation of a resist pattern, then within the exposed portions, acid is generated from the acid-generator component, and the action of this acid causes an increase in the solubility of the resin component in an alkali developing solution, making the exposed portions soluble in the alkali developing solution. In this manner, the unexposed portions remain to form a positive resist pattern. The base resin used exhibits increased polarity by the action of acid, thereby exhibiting increased solubility in an alkali developing solution, whereas the solubility in an organic solvent is decreased. Therefore, when such a base resin is applied to a process using a developing solution containing an organic solvent (organic developing solution) (hereafter, this process is referred to as "solvent developing process" or "negative tone-developing process") instead of an alkali developing process, the solubility of the exposed portions in an organic developing solution is decreased. As a result, in the solvent developing process, the unexposed portions of the resist film are dissolved and removed by the organic developing solution, and a negative resist pattern in which the exposed portions are remaining is formed.

However, in the case of positive tone development process in which a resist composition that forms a positive resist pattern by an alkali development process, when a trench pattern (isolated space pattern) or a hole pattern is formed, it becomes necessary to form a resist pattern using an incident light weaker than that used in the case of a line pattern or a dot pattern, such that the contrast of the intensity of the incident light between exposed portions and unexposed portions becomes unsatisfactory. Therefore, pattern formation performance such as resolution tends to be restricted, and it becomes difficult to form a resist pattern with a high resolution.

In contrast, a negative tone development process using a negative type, chemically amplified resist composition (i.e., a chemically amplified resist composition which exhibits decreased alkali solubility in an alkali developing solution upon exposure) in combination with an organic developing solution is advantageous over the positive tone development process in the formation of a trench pattern or a hole pattern. For this reason, in recent years, negative tone development process has been considered important for formation of fine patterns, and base resins and the like suitable for negative tone development process have been proposed.

For example, Patent Document 1 discloses a negative-tone development resist composition containing a resin having a structural unit derived from (meth)acrylate ester as a main chain, and a method of forming a pattern.

As miniaturization of resist pattern is required, there has been proposed methods in which a resist pattern is subjected to a thermal treatment to fluidize the pattern and downsize the pattern (see Patent Documents 2 to 4). For example, Patent Document 2 discloses a method in which a resist pattern is formed on a substrate, followed by a thermal treatment to change the cross-sectional shape of the resist pattern from a rectangular shape to a semicircular shape to increase the bottom length, thereby forming a minute pattern. Patent Document 3 discloses a method in which a resist pattern is formed, followed by heating the pattern around its softening temperature, so as to fluidize the resist to change the pattern size, thereby forming a minute pattern. Patent Document 4 discloses a method in which a positive resist composition containing a resin having a specific structure is used to form a resist pattern, followed by a thermal flow treatment, thereby forming a minute resist pattern.

DOCUMENTS OF RELATED ART

Patent Document

[Patent Document 1] Japanese Unexamined Patent Application, First Publication No. 2009-025723
[Patent Document 2] Japanese Unexamined Patent Application, First Publication No. Hei 1-307228
[Patent Document 3] Japanese Unexamined Patent Application, First Publication No. Hei 4-364021
[Patent Document 4] Japanese Patent No. 4657883

SUMMARY OF THE INVENTION

Hereafter, as integration and miniaturization of semiconductor devices further proceed, a method of forming a resist pattern capable of forming a more minute pattern is demanded. Further, it is required that the resist pattern is not only minute, but also the uniformity of the pattern be improved.

However, in a negative tone development, when a thermal treatment as disclosed in Patent Documents 2 to 4 is conducted to downsize the pattern, i.e., reducing the intervals between the patterns (e.g., the diameter of hole in a contact hole pattern, the space width in the case of a space (trench) pattern), there was a problem that the intervals between the patterns are rather increased, so that the miniaturization of the pattern cannot be achieved. In a negative tone development, a portion where part of groups are eliminated by exposure so as to exhibit decreased solubility in a developing solution becomes a pattern portion (portion which becomes the side wall of a contact hole pattern or a space pattern). It is presumed that, by conducting a thermal treatment to such a pattern, gaps generated by elimination of groups by exposure are intruded by the film surrounding the gaps, so that the entire resist film and the pattern portions shrink, thereby resulting in the increase of the intervals between the patterns. As such, in a negative tone development, there has been demanded a method in which pattern size can be miniaturized simply without affecting the pattern portions, and improving the pattern uniformity.

The present invention takes the above circumstances into consideration, with an object of providing a method of forming a resist pattern by a negative tone process using a developing solution containing an organic solvent which enables miniaturization of the pattern size and improvement in the pattern uniformity.

For solving the above-mentioned problems, the present invention employs the following aspects.

Specifically, a first aspect of the present invention is a method of forming a resist pattern, including: a step of forming a resist film on a substrate using a resist composition containing a base component (A) which exhibits decreased solubility in an organic solvent under action of acid and an acid-generator component (B) which generates acid upon exposure; a step of subjecting the resist film to exposure; a step of patterning the resist film by a negative-tone development using a developing solution containing the organic solvent to form a resist pattern; a step of applying a coating material to the resist pattern, thereby forming a coating film; a step of performing a thermal treatment at a temperature lower than the softening point of the resist pattern, thereby heat shrinking the coating film to narrow an intervals between the resist pattern; and a step of removing the coating film.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

An "acrylate ester" refers to a compound in which the terminal hydrogen atom of the carboxy group of acrylic acid ($CH_2=CH-COOH$) has been substituted with an organic group.

A "structural unit derived from an acrylate ester" refers to a structural unit that is formed by the cleavage of the ethylenic double bond of an acrylate ester.

Examples of the substituent bonded to the carbon atom on the α-position in the "acrylate ester which may have the hydrogen atom bonded to the carbon atom on the α-position substituted with a substituent" include a halogen atom, an alkyl group of 1 to 5 carbon atoms, a halogenated alkyl group of 1 to 5 carbon atoms and a hydroxyalkyl group. With respect to the "structural unit derived from an acrylate ester", the "α-position (the carbon atom on the α-position)" refers to the carbon atom having the carbonyl group bonded thereto, unless specified otherwise.

Examples of the halogen atom as the substituent which may be bonded to the carbon atom on the α-position include a fluorine atom, a chlorine atom, a bromine atom and an iodine atom.

Specific examples of the alkyl group of 1 to 5 carbon atoms for the substituent which may be bonded to the carbon atom on the α-position include linear or branched alkyl groups such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group of 1 to 5 carbon atoms for the substituent include groups in which part or all of the hydrogen atoms of the aforementioned "alkyl group of 1 to 5 carbon atoms for the substituent" are substituted with halogen atoms. Examples of the halogen atom include a fluorine atom, a chlorine atom, a bromine atom and an iodine atom, and a fluorine atom is particularly desirable.

Specific examples of the hydroxyalkyl group of 1 to 5 carbon atoms for the substituent include groups in which part or all of the hydrogen atoms of the aforementioned "alkyl group of 1 to 5 carbon atoms for the substituent" are substituted with hydroxy groups.

In the present invention, it is preferable that a hydrogen atom, an alkyl group of 1 to 5 carbon atoms or a halogenated alkyl group of 1 to 5 carbon atoms is bonded to the carbon atom on the α-position, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

The term "exposure" is used as a general concept that includes irradiation with any form of radiation.

According to the present invention, there is provided a method of forming a resist pattern by a negative tone process using a developing solution containing an organic solvent which enables miniaturization of the pattern size and improvement in the pattern uniformity.

MODE FOR CARRYING OUT THE INVENTION

A method of forming a resist pattern according to a first aspect of the present invention includes: a step of forming a resist film on a substrate using a resist composition containing a base component (A) which exhibits decreased solubility in an organic solvent under action of acid and an acid-generator component (B) which generates acid upon exposure; a step of subjecting the resist film to exposure; a step of patterning the resist film by a negative-tone development using a developing solution containing the organic solvent to form a resist pattern; a step of applying a coating material to the resist pattern, thereby forming a coating film; a step of performing a thermal treatment at a temperature lower than the softening point of the resist pattern, thereby heat shrinking the coating film to narrow an interval between the resist pattern; and a step of removing the coating film.

In a negative tone-development resist composition used in the method of forming a resist pattern according to the present invention, when radial rays are irradiated (when exposure is conducted), acid is generated from the acid-generator component (B), and the solubility of the base component (A) in an organic solvent is decreased by the action of the acid. Therefore, in the formation of a resist pattern, by conducting selective exposure of a resist film formed by using the negative tone-development resist composition, the solubility of the exposed portions in an organic developing solution containing an organic developing solution is decreased, whereas the solubility of the unexposed portions in an organic developing solution is unchanged, and hence, a resist pattern can be formed by removing the unexposed portions by negative tone development using an organic developing solution.

The negative tone-development resist composition used in the present invention will be described later in detail.

Hereinbelow, the method of forming a resist pattern according to the present invention will be specifically described referring to each of the steps.

Method of Forming Resist Pattern (I) Resist Film Forming Step

Firstly, a negative tone-development resist composition is applied to a substrate using a spinner or the like, and a bake treatment (post applied bake (PAB)) is conducted at a temperature of 80 to 150° C. for 40 to 120 seconds, preferably 60 to 90 seconds, to form a resist film.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

(II) Resist Film Exposure Step

Subsequently, the thus formed resist film is subjected to selective exposure, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern.

Following exposure, baking treatment (post exposure baking (PEB)) is preferably conducted under temperature conditions of 80 to 150° C. for 40 to 120 seconds, and preferably 60 to 90 seconds, so as to satisfactorily proceed the deprotection reaction by the acid generated upon exposure.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition which can be used in the present invention (described later) is effective to KrF excimer laser, ArF excimer laser, EB and EUV, and particularly effective to ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

(III) Resist Pattern Forming Step

Next, the resist film after exposure is subjected to developing treatment using a developing solution containing an organic solvent (an organic developing solution), preferably followed by rinsing with a rinse liquid containing an organic solvent, and then drying is conducted. By performing a rinse treatment, an excellent pattern can be formed.

After the developing treatment or the rinsing, the developing solution or the rinse liquid remaining on the pattern can be removed by a treatment using a supercritical fluid.

If necessary, after the developing treatment, the rinsing or the treatment with a supercritical fluid, a bake treatment (post bake) may be conducted to remove any remaining organic solvent.

(Organic Developing Solution)

As the organic solvent contained in the organic developing solution used for developing, any of the conventional organic solvents can be used which are capable of dissolving the base component (A) (prior to exposure) can be appropriately selected. Specific examples of the organic solvent include polar solvents such as ketone solvents, ester solvents, alcohol solvents, amide solvents and ether solvents, and hydrocarbon solvents. Among these, ester solvents and ketone solvents are preferable. As an ester solvent, butyl acetate is preferable. As a ketone solvent, methyl amyl ketone (2-heptanone) is preferable.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxy group within the structure thereof, and an "alcoholic hydroxy group" refers to a hydroxy group bonded to a carbon atom of an aliphatic hydrocarbon group. An amide solvent is an organic solvent containing an amide group within the structure thereof. An ether solvent is an organic solvent containing C—O—C within the structure thereof. Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent. A hydrocarbon solvent consists of a hydrocarbon, and does not have any substituent (atom or group other than hydrogen and carbon).

Examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone).

Examples of ester solvents include methyl acetate, butyl acetate, ethyl acetate, isopropyl acetate, amyl acetate, isoamyl acetate, ethyl methoxyacetate, ehtyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

As the ester solvent, a solvent represented by general formula (1) described later or a solvent represented by general formula (2) described later is preferable, a solvent represented by general formula (1) is more preferable, an alkyl acetate is still more preferable, and butyl acetate is particularly desirable.

Examples of alcohol solvents include monohydric alcohols, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol and 3-methoxy-1-butanol; glycol solvents, such as ethylene glycol, diethylene glycol and triethylene glycol; and glycol ether solvents containing a hydroxy group, such as ethylene glycol monomethyl ether, propylene glycol monomethyl ether, diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether and propylene glycol monophenyl ether. Among these examples, a glycol ether solvent is preferable.

Examples of amide solvents include N-methyl-2-pyrrolidone, N,N-dimethyl acetamide, N,N-dimethylformamide, hexamethylphosphoric amide and 1,3-dimethyl-2-imidazolidinone.

Examples of ether solvents include the aforementioned glycol ether solvents containing a hydroxy group; glycol ether solvents containing no hydroxy group, such as propylene glycol dimethyl ether, propylene glycol diethyl ether, diethylene glycol dimethyl ether and diethylene glycol diethyl ether: dioxane; tetrahydrofuran; anisole; perfluoro-2-butyltetrahydrofuran, perfluorotetrahydrofuran and 1,4-dioxane. Among these, a glycol ether solvent containing a hydroxy group or a glycol ether solvent containing no hydroxy group is preferable.

Examples of hydrocarbon solvents include aliphatic hydrocarbon solvents, such as pentane, hexane, octane, decane, 2,2,4-trimethylpentane, 2,2,3-trimethylhexane, perfluorohexane and perfluoronpetane; and aromatic hydrocarbon solvents, such as toluene, xylene, ethylbenzene, propyl benzene, 1-methylpropylbenzene, 2-methylpropylbenzene, dimethylbenzene, diethylbenzene, ethylmethylbenzene, trimethylbenzene, ethyldimethylbenzene and dipropylbenzene. Among these examples, an aromatic hydrocarbon solvent is preferable.

These organic solvents can be used individually, or at least 2 solvents may be mixed together. Further, an organic solvent other than the aforementioned examples or water may be mixed together.

As the organic solvent for the organic developing solution, a solvent represented by general formula (1) or (2) shown below is preferable.

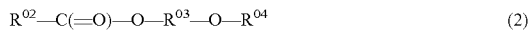

In formula (1), each of $R^{00}$ and $R^{01}$ independently represents a hydrogen atom, an alkyl group, an alkoxy group, an alkoxycarbonyl group, a carboxy group, a hydroxy group, a cyano group or a halogen atom, provided that $R^{00}$ and $R^{01}$ may be mutually bonded to form a ring. In formula (2), each of $R^{02}$ and $R^{04}$ independently represents a hydrogen atom, an alkyl group, an alkoxy group, an alkoxycarbonyl group, a carboxy group, a hydroxy group, a cyano group or a halogen atom, provided that $R^{02}$ and $R^{04}$ may be mutually bonded to form a ring; and $R^{03}$ represents an alkylene group.

In formula (1), the alkyl group for $R^{00}$ and $R^{01}$ may be linear, branched or cyclic, preferably linear or branched, and preferably has 1 to 5 carbon atoms. The alkyl group may have a substituent. Examples of the substituent include a hydroxy group, a carboxy group and a cyano group.

As the alkyl group within the alkoxy group and the alkoxycarbonyl group, the same alkyl groups as those described above can be used.

Examples of the halogen atom include a fluorine atom, a chlorine atom, a bromine atom and an iodine atom, and a fluorine atom is preferable.

It is preferable that $R^{00}$ and $R^{01}$ each independently represents a hydrogen atom or an alkyl group.

Specific example of the solvent represented by formula (1) include methyl acetate, butyl acetate, ethyl acetate, isopropyl acetate, pentyl acetate, isopentyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate and ethyl 2-hydroxypropionate.

Among the aforementioned examples, as the solvent represented by formula (1), those in which $R^{00}$ and $R^{01}$ both represent an unsubstituted alkyl group is preferable, an alkyl acetate is more preferable, and butyl acetate is particularly desirable.

In formula (2), $R^{02}$ and $R^{04}$ are the same as defined for $R^{00}$ and $R^{01}$ described above.

The alkylene group for $R^{03}$ may be linear, branched or cyclic, preferably linear or branched, and preferably has 1 to 5 carbon atoms. The alkylene group may have a substituent. Examples of the substituent include a hydroxy group, a carboxy group and a cyano group. When the alkylene group has 2 or more carbon atoms, an oxygen atom (—O—) may be present between the carbon atoms within the alkylene group.

Specific example of the solvent represented by formula (2) include ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monomethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, ethyl methoxyacetate, ethyl ethoxyacetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate and 4-methyl-4-methoxypentyl acetate.

The solvent represented by formula (1) and/or (2) can be used individually, or at least 2 types of solvents may be mixed together. Further, another solvent may be mixed together.

The other solvent is not particularly limited as long as it can be mixed with the solvent represented by formula (1) or (2) without being separated, and can be appropriately selected from the aforementioned ester solvents, ketone solvents, alcohol solvents, amide solvents, ether solvents and hydrocarbon solvents.

In terms of reducing the cost, it is preferable to use an organic solvent containing no halogen atom as the organic developing solution. The amount of the organic solvent containing no halogen atom, based on the total weight of the organic developing solvent is preferably 60% by weight or more, more preferably 80% by weight or more, still more preferably 90% by weight or more, and may be even 100% by weight.

The boiling point of the organic solvent used as the organic developing solution is preferably 50° C. to lower than 250° C.

The ignition point of the organic solvent used as the organic developing solution is preferably 200° C. or higher.

If desired, the organic developing solution may have a conventional additive blended. Examples of the additive include surfactants. The surfactant is not particularly limited, and for example, an ionic or non-ionic fluorine and/or silicon surfactant can be used.

Examples of commercially available surfactants include fluorine surfactants or silicon surfactants such as F Top EF301, EF303 (produced by Shinakita Kasei K.K.), Florad FC430, FC431 (produced by Sumitomo 3M), Megafac F171, F 173, F176, F189, R08 (produced by DIC Corporation), Surflon S-382, SC101, SC102, SC103, SC104, SC105, SC106 (Asahi Glass Company, Limited) and Troysol S-366 (troy chemical corporation). Further, polysiloxane polymer KP-341 (produced by The Shin-etsu Chemical Industry Co., Ltd.) can be used as a silicon surfactant.

Further, other than the aforementioned conventional surfactants, there can be used a surfactant containing a polymer having a fluoroaliphatic group derived from a fluoroaliphatic compound produced by a telomerization method (telomer method) or an oligomerization method (oligomer method). The fluoroaliphatic compound can be produced by a method described in Japanese Unexamined Patent Application, First Publication No. 2002-90991.

As the polymer containing a fluoroaliphatic group, a copolymer of a monomer containing a fluoroaliphatic group and a (poly(oxyalkylene))acrylate and/or (poly(oxyalkylene))methacrylate is preferable. The copolymer may be either a random copolymer or a block copolymer. Examples of the poly(oxyalkylene) group include a poly(oxyethylene group) a poly(oxypropylene) group and a poly(oxybutylene) group. Alternatively, a unit in which different types of alkylene chains exist within the same chain may be used, such as a poly(block linkage of oxyethylene, oxypropylene and oxyethylene) or a poly(block linkage of oxyethylene and oxypropylene). Furthermore, the copolymer of a monomer having a fluoroaliphatic group and a (poly(oxyalkylene))acrylate (or methacrylate) may not only be a bipolymer, but may be a terpolymer or more in which 2 or more types of monomers having a fluoroaliphatic group or 2 or more types of (poly(oxyalkylene))acrylate (or methacrylate) have been copolymerized together.

Examples of such surfactants which are commercially available include Megafac F178, Megafac F470, Megafac F473, Megafac F475, Megafac F476 and Megafac F472 (produced by DIC Corporation). Further examples include a copolymer containing an acrylate (or a methacrylate) having a C6F13 group and a (poly(oxyalkylene))acrylate (or methacrylate), a copolymer containing an acrylate (or a methacrylate) having a C6F 13 group, a (poly(oxyethylene))acrylate (or methacrylate) and a (poly(oxypropylene))acrylate (or methacrylate), a copolymer containing an acrylate (or a methacrylate) having a C8F17 group and a (poly(oxyalkylene)) acrylate (or methacrylate), and a copolymer containing an acrylate (or a methacrylate) having a $C_8F_{17}$ group, a (poly(oxyethylene))acrylate (or methacrylate) and a (poly(oxypropylene))acrylate (or methacrylate).

As the surfactant, a non-ionic surfactant is preferable, and a fluorine surfactant or a silicon surfactant is more preferable.

When a surfactant is added, the amount thereof based on the total amount of the organic developing solution is generally 0.001 to 5% by weight, preferably 0.005 to 2% by weight, and more preferably 0.01 to 0.5% by weight.

The development treatment using the organic developing solution can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

(Rinse Liquid)

After the developing treatment and before drying, a rinse treatment may be performed using a rinse liquid containing an organic solvent. By performing a rinse treatment, an excellent pattern can be formed.

As the organic solvent used for the rinse liquid, any of the aforementioned organic solvents for the organic developing solution can be used which hardly dissolve the pattern. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, more preferably at least one solvent selected from the group consisting of alcohol solvents and ester solvents, and an alcohol solvent is particularly desirable.

The alcohol solvent used for the rinse liquid is preferably a monohydric alcohol of 6 to 8 carbon atoms, and the monohydric alcohol may be linear, branched or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol and benzyl alcohol. Among these, 1-hexanol, 2-heptanol and 2-hexanol are preferable, and 1 hexanol and 2-hexanol are more preferable.

These organic solvents can be used individually, or at least 2 solvents may be mixed together. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the organic developing solution may have a conventional additive blended. Examples of the additive include surfactants. As the surfactant, the same surfactants as those described above can be mentioned, and a non-ionic surfactant is preferable, and a fluorine surfactant or a silicon surfactant is more preferable.

When a surfactant is added, the amount thereof based on the total amount of the rinse liquid is generally 0.001 to 5% by weight, preferably 0.005 to 2% by weight, and more preferably 0.01 to 0.5% by weight.

The rinse treatment (washing treatment) using the rinse liquid can be performed by a conventional rinse method. Examples thereof include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

(IV) Coating Film Forming Step

Next, to the resist pattern obtained by the developing treatment, a coating material is applied by a spinner or the like, thereby forming a coating film of the coating material. The thickness of the coating film is not particularly limited, but is preferably the same as or larger than the height (thickness) of the pattern portion of the resist pattern formed in the previous step. That is, it is preferable that the coating film entirely cover the upper edge of the resist pattern.

After applying the coating material, the coating material may be subjected to drying under temperature conditions of 80 to 100° C. for 30 to 90 seconds.

Further, after forming the coating film, a rinse treatment may be conducted, so as to remove excess coating material.

(Coating Material)

The coating material used in the present invention is not particularly limited as long as it is capable of being coated on the resist pattern and narrowing the intervals between the patterns. However, since the coating material is applied to the pattern to form a film, it is preferable that the coating material contains a component that dissolves in water or an organic solvent at room temperature. Among these, the coating material used in the present invention preferably contains a component that is capable of being dissolved in water at room temperature because an aqueous solvent hardly affects the resist pattern which becomes a lower layer when the coating material is applied thereto. It is particularly desirable that the coating material contains an aqueous polymer. Further, because the coating film will be removed in a later step, an aqueous polymer is preferable in terms of ease in removability.

Specific examples of aqueous polymers include alkylene glycol polymers, cellulosic derivatives, vinyl polymers, acrylic polymers, urea polymers, epoxy polymers, melamine polymers and nylon polymers. The coating material used in the present invention preferably contains at least one aqueous polymer selected from the group consisting of the above-described aqueous polymers.

Examples of alkylene glycol polymers include polymers or copolymers (addition polymers or addition copolymers) containing alkylene glycol monomers such as ethylene glycol and propylene glycol.

Examples of cellulosic derivatives include polymers and copolymers containing cellulose monomers such as hydroxypropyl methylcellulose phthalate, hydroxypropyl cellulose acetate phthalate, hydroxypropyl methylcellulose hexahydrophthalate, hydroxypropyl methylcellulose acetate succinate, hydroxypropyl methyl cellulose, hydroxypropyl cellulose, hydroxyethyl cellulose, cellulose acetate hexahydrophthalate, carboxymethyl cellulose, ethyl cellulose and methyl cellulose.

Examples of vinyl polymers include polymers and copolymers containing vinyl monomers such as N-vinyl pyrrolidone, vinyl imidazolidinone and vinyl acetate.

Examples of acrylic polymers include polymers and copolymers containing acrylic monomers such as acrylic acid, methyl acrylate, methacrylic acid, methyl methacrylate, N,N-dimethyl acrylamide, N,N-dimethylaminopropyl methacrylamide, N,N-dimethylaminopropyl acrylamide, N-methyl acrylamide, diacetone acrylamide, N,N-dimethylaminoethyl methacrylate, N,N-diethylaminoethyl methacrylate, N,N-dimethylaminoethyl acrylate and acryloylmorpholine.

Examples of urea polymers include polymers and copolymers containing urea monomers such as methylol urea, dimethylol urea and ethylene urea.

As the epoxy polymer, there is no particular limitation as long as it is an epoxy polymer which is soluble in water, and examples thereof include diethylene glycol diglycidyl ether, polyethylene glycol diglycidyl ether, glycerol polyglycidyl ether and polyglycerol polyglycidyl ether.

Examples of melamine polymers include melamine polymers having as a component thereof methoxymethyl melamine, isobutoxymethyl methoxymethyl melamine and methoxyethyl melamine.

As the nylon polymer, there is no particular limitation as long as it is a nylon polymer which is soluble in water, and can be obtained by a hydrophilic monomer such as acrylic acid to nylon.

The coating material used in the present invention preferably contains at least one member selected from the group consisting of alkylene glycol polymers, cellulose polymers, vinyl polymers and acrylic polymers, and it is particularly desirable that the coating material contains an acrylic polymer. By using an acrylic polymer, due to the acidic pH of the acrylic polymer, it becomes easier to adjust the pH of the coating material by appropriately combining with other components (described later) which can be contained in the coating material. Further, by using an acrylic polymer, when heating is conducted in the thermal treatment step described later, the coating film of the coating material does not cause reactions such as cross-linking with the resist pattern, so that the coating film can be easily removed.

As the acrylic polymer, an acrylic polymer consisting of acrylate monomers may be used, although a copolymer with other monomers is preferable in that the size of the resist pattern can be narrowed. As the other monomer, an N-vinylpyrrolidone monomer is preferably because the shrink ratio at the time of heating is particularly large. When an N-vinylpyrrolidone monomer is used, the N-vinylpyrrolidone monomer functions as a proton donor, and the acrylic monomer functions as a proton acceptor.

When the aqueous polymer is used as a copolymer, the compositional ratio is not particularly limited. However, when the stability with time is considered as an important factor, it is preferable that the blend ratio of the acrylic polymer be larger than the other polymer components. Other than blending excess amount of acrylic polymer as described above, the stability with time can be improved by adding an acidic compound such as p-toluenesulfonic acid or dodecylbenzenesulfonic acid.

As the aqueous polymer, one type of polymer may be used alone, or two or more types of polymers may be used in combination.

The coating material may further contain an aqueous amine. By blending an aqueous amine, generation of impurities can be prevented, and pH can be easily adjusted.

As the aqueous amine, in terms of preventing generation of impurities and adjusting pH, among the amines described later for the (D) component of the resist composition, amines exhibiting pKa (acid dissociation constant) in an aqueous solution at 25° C. of 7.5 to 13 are preferable, aliphatic amines are more preferable, and triethylamine is particularly desirable.

In the present invention, when the coating material contains an aqueous amine, the amount of the aqueous amine based on the total solid content of the coating material is preferably 0.1 to 30% by weight, and more preferably 2 to 15% by weight. When the amount of the aqueous amine is at least as large as the lower limit of the above-mentioned range, deterioration of the coating material with time can be prevented. On the other hand, when the amount of the aqueous amine is no more than the upper limit of the above-mentioned range, the resist pattern which becomes a lower layer is not adversely affected.

Furthermore, the coating material preferably contains a surfactant. By using a surfactant, generation of defects can be effectively prevented. The surfactant is not particularly limited, and any surfactant typically used for resist compositions can be used. Examples of particularly preferable surfactants include N-alkylpyrrolidone surfactants, quaternary ammonium salt surfactants and polyoxyethylene phosphate surfactants.

In the present invention, the coating material is preferably dissolved in water or a mixed solvent of water and an alcohol solvent (the alcohol content preferably being 30% by weight or less) for use. As examples of the alcohol solvent, the same alcohol solvents as those described above for the developing solution can be given. The solid content within the coating material is preferably 3 to 50% by weight, and more preferably 5 to 20% by weight.

Further, from the viewpoint of miniaturization of pattern size, suppressing generation of defects, and the like, if desired, a non-amine water-soluble organic solvent may be added.

In the present invention, the pH of the coating material used is not particularly limited, but in consideration of hardly affecting the resist pattern as a lower layer, the pH is preferably 11 or less, more preferably 1 to 9, still more preferably 1 to 7, and most preferably 1 to 5.

(V) Thermal Treatment Step

The resist pattern and the coating film formed on the substrate as described above is subjected to a thermal treatment at a temperature lower than the softening point of the resist pattern. Here, the softening point of the resist pattern refers to a bake treatment temperature at which heat fluid flow of the pattern occurs and change in the size starts when a resist pattern formed on a substrate is subjected to baking.

By conducting thermal treatment, heat shrinking of the coating film covering the resist pattern occurs. As a result, side walls of the pattern portions of the resist pattern (i.e., portions where the resist film remain) is pulled toward the space portions of a space pattern (trench pattern) or hole portions of a contact hole pattern (i.e., portions where the resist film has been removed), so that the intervals between the resist patterns become narrower than those prior to the heat shrinking.

The heating temperature is not particularly limited, as long as it is a temperature which causes heat shrinking of the coating film and does not cause softening of the resist pattern (i.e., a temperature lower than the softening point of the resist pattern), and the heating temperature can be appropriately selected depending on the types of the coating material and the resist composition. When a general coating material and a general resist composition are used, the heating temperature is about 80 to 200° C.

(VI) Coating Film Removing Step

Finally, the coating film which has been subjected to the thermal treatment is removed.

The method of removing the coating film is not particularly limited, and can be appropriately selected depending on the type of the coating material. For example, when the coating material is an aqueous polymer dissolved in water or a mixed solvent of water and an alcohol solvent, washing can be conducted for 10 to 120 seconds using an aqueous solvent, preferably pure water, thereby removing the coating film. The washing treatment can be conducted in the same manner as in the rinse treatment using the aforementioned rinse liquid.

In the present invention, by removing the coating film after narrowing the intervals between the patterns, the coating film would not affect the shape of the resist pattern (cause generation of size defect), and become an obstacle in a later step such as etching.

Negative Tone-Development Resist Composition

The negative tone-development resist composition used in the method of forming a resist pattern according to the present invention (hereafter, frequently referred to simply as "resist composition") includes a base component (A) (hereafter, referred to as "component (A)") which exhibits decreased solubility in an organic developing solution under action of acid and an acid-generator component (B) (hereafter, referred to as "component (B)") which generates acid upon irradiation, and is used in the method of forming a resist pattern described above.

In the resist composition, when radial rays are irradiated (when exposure is conducted), at exposed portions, acid is generated from the component (B), and the solubility of the component (A) in an organic is decreased by the action of the generated acid. Therefore, in the formation of a resist pattern, by conducting selective exposure of a resist film formed by using the resist composition, the solubility of the exposed portions in a developing solution containing an organic developing solution is decreased, whereas the solubility of the unexposed portions in an organic developing solution is unchanged, and hence, a resist pattern can be formed by removing the unexposed portions by negative tone development using an organic developing solution.

<Component (A)>

As the component (A), an organic compound typically used as a base component for a chemically amplified resist composition can be used alone, or two or more of such organic compounds can be mixed together.

Here, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The "organic compound having a molecular weight of 500 or more" which can be used as a base component is broadly classified into non-polymers and polymers.

In general, as a non-polymer, any of those which have a molecular weight in the range of 500 to less than 4,000 is used. Hereafter, a non-polymer having a molecular weight in the range of 500 to less than 4,000 is referred to as a low molecular weight compound.

As a polymer, any of those which have a molecular weight of 1,000 or more is generally used. Hereafter, a polymer having a molecular weight of 1,000 or more is referred to as a polymeric compound. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

As the component (A), a resin component which exhibits changed solubility in a developing solution under action of acid may be used. Alternatively, as the component (A), a low molecular weight material which exhibits changed solubility in a developing solution under action of acid may be used.

Since the resist composition used in the present invention is a resist composition which forms a negative pattern in a solvent developing process, it is preferable to use a base component (A0) (hereafter, referred to as "component (A0)") which exhibits increased polarity by the action of acid. By using the component (A0), since the polarity of the base component changes prior to and after exposure, an excellent development contrast can be obtained in a solvent developing process.

The component (A0) exhibits high solubility in an organic developing solution prior to exposure, and when acid is generated from the component (B) upon exposure, the polarity of the component (A0) is increased by the action of the generated acid, thereby decreasing the solubility of the component (A0) in an organic developing solution. Therefore, in the formation of a resist pattern, by conducting selective exposure of a resist film formed by applying the resist composition to a substrate, the exposed portions changes from an soluble state to an insoluble state in an organic developing solution, whereas the unexposed portions remain soluble in an organic developing solution. As a result, by conducting development using an organic developing solution, a contrast can be made between the exposed portions and unexposed portions, thereby enabling the formation of a negative resist pattern.

The component (A0) may be a resin component (A1) that exhibits increased polarity under the action of acid (hereafter, frequently referred to as "component (A1)"), a low molecular weight material (A2) that exhibits increased polarity under the action of acid (hereafter, frequently referred to as "component (A2)"), or a mixture thereof.

[Component (A1)]

As the component (A1), a resin component (base resin) typically used as a base component for a chemically amplified resist composition can be used alone, or two or more of such resin components can be mixed together.

In the present invention, the component (A1) preferably has a structural unit derived from an acrylate ester which may have the hydrogen atom bonded to the carbon atom on the α-position substituted with a substituent.

In the resist composition used in the present invention, it is particularly desirable that the component (A1) has a structural unit (a1) derived from an acrylate ester which may have the hydrogen atom bonded to the carbon atom on the α-position substituted with a substituent and contains an acid decomposable group which exhibits increased polarity by the action of acid.

The component (A1) preferably includes, in addition to the structural unit (a1), at least one structural unit (a2) selected from the group consisting of a structural unit derived from an acrylate ester containing an —$SO_2$— containing cyclic group and which may have the hydrogen atom bonded to the carbon atom on the α-position substituted with a substituent and a structural unit derived from an acrylate ester containing a lactone-containing cyclic group and which may have the hydrogen atom bonded to the carbon atom on the α-position substituted with a substituent.

Furthermore, it is preferable that the component (A1) include a structural unit (a3) derived from an acrylate ester containing a polar group-containing aliphatic hydrocarbon group and may have the hydrogen atom bonded to the carbon atom on the α-position substituted with a substituent, as well as the structural unit (a1), or the structural unit (a1) and the structural unit (a2).

(Structural Unit (a1))

The structural unit (a1) is a structural unit derived from an acrylate ester which may have the hydrogen atom bonded to the carbon atom on the α-position substituted with a substituent and contains an acid decomposable group which exhibits increased polarity by the action of acid.

The term "acid decomposable group" refers to a group in which at least a part of the bond within the structure thereof is cleaved by the action of acid generated from the component (B) upon exposure.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—$SO_3H$). Among these, a polar group containing —OH in the structure thereof (hereafter, referred to as "OH-containing polar group") is preferable, and a carboxy group or a hydroxy group is more preferable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

An "acid dissociable group" is a group in which at least the bond between the acid dissociable group and the adjacent carbon atom is cleaved by the action of acid generated from the component (B) upon exposure. It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, in the case of applying an alkali developing process, the solubility in an alkali developing solution is relatively increased. On the other hand, in the case of applying a solvent developing process, the solubility in an organic developing solution containing an organic solvent decreases.

As the acid dissociable group for the structural unit (a1), any of those which have been proposed as acid dissociable groups for a base resin of a chemically amplified resist may be used. Generally, groups that form either a cyclic or chain-like tertiary alkyl ester with the carboxyl group of the (meth) acrylic acid, and acetal-type acid dissociable groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxy group. As a result, the polarity of the component (A1) is increased.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable groups".

Examples of tertiary alkyl ester-type acid dissociable groups include aliphatic branched, acid dissociable groups and aliphatic cyclic group-containing acid dissociable groups.

In the present description and claims, the term "aliphatic branched" refers to a branched structure having no aromaticity.

The "aliphatic branched, acid dissociable group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid dissociable groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable group, for example, a group which has a tertiary carbon atom on the ring structure of the cycloalkyl group can be used.

Specific examples include groups represented by any one of general formulas (1-1) to (1-9) shown below, such as a 2-methyl-2-adamantyl group and a 2-ethyl-2-adamantyl group.

Further, as examples of aliphatic branched acid dissociable group, groups having an aliphatic cyclic group such as an adamantyl group, cyclohexyl group, cyclopentyl group, norbornyl group, tricyclodecyl group or tetracyclododecyl group, and a branched alkylene group having a tertiary carbon atom bonded thereto, as those represented by general formulas (2-1) to (2-6) shown below, can be given.

[Chemical Formula 1]

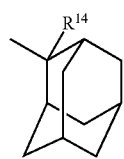
(1-1)

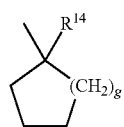
(1-2)

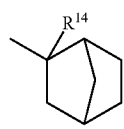
(1-3)

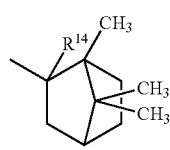
(1-4)

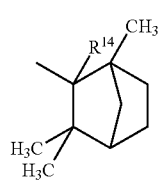
(1-5)

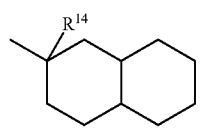
(1-6)

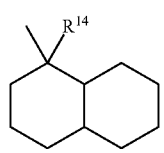
(1-7)

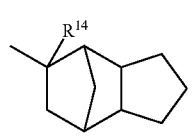
(1-8)

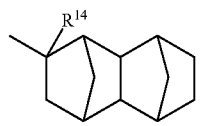
(1-9)

In the formulas above, $R^{14}$ represents an alkyl group; and g represents an integer of 0 to 8.

[Chemical Formula 2]

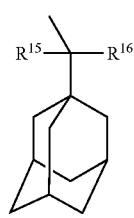
(2-1)

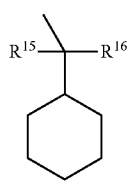
(2-2)

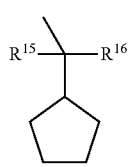
(2-3)

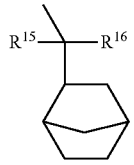
(2-4)

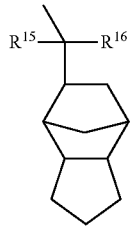
(2-5)

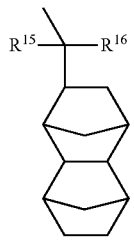
(2-6)

In the formulas, each of $R^{15}$ and $R^{16}$ independently represents an alkyl group (which may be linear or branched, and preferably has 1 to 5 carbon atoms).

As the alkyl group for $R^{14}$, a linear or branched alkyl group is preferable.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group or a tert-butyl group is particularly desirable.

g is preferably an integer of 0 to 3, more preferably 1 to 3, and still more preferably 1 or 2.

As the alkyl group for $R^{15}$ and $R^{16}$, the same alkyl groups as those for $R^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable group" generally substitutes a hydrogen atom at the terminal of an OH-containing polar group such as a carboxy group or hydroxyl group, so as to be bonded with an oxygen atom. When acid is generated upon exposure, the generated acid acts to break the bond between the acetal-type acid dissociable group and the oxygen atom to which the acetal-type, acid dissociable group is bonded, thereby forming an OH-containing polar group such as a carboxy group or a hydroxy group. As a result, the polarity of the component (A1) is increased.

Examples of acetal-type acid dissociable groups include groups represented by general formula (p1) shown below.

[Chemical Formula 3]

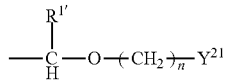

(p1)

In the formula, each of $R^{1\prime}$ and $R^{2\prime}$ independently represent a hydrogen atom or an alkyl group of 1 to 5 carbon atoms; n represents an integer of 0 to 3; and $Y^{21}$ represents an alkyl group of 1 to 5 carbon atoms or an aliphatic cyclic group.

In general formula (p1) above, n is preferably an integer of 0 to 2, more preferably 0 or 1, and most preferably 0.

As the alkyl group of 1 to 5 carbon atoms for $R^{1\prime}$ and $R^{2\prime}$, the same alkyl groups of 1 to 5 carbon atoms as those described above for R can be used, although a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable group (p1) is a group represented by general formula (p1-1) shown below.

[Chemical Formula 4]

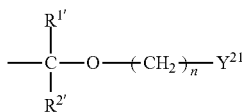

(p1-1)

In the formula, $R^{1\prime}$, n and $Y^{21}$ are the same as defined above.

As the alkyl group of 1 to 5 carbon atoms for $Y^{21}$, the same alkyl groups of 1 to 5 carbon atoms as those described above can be used.

As the aliphatic cyclic group for $Y^{21}$, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable group, groups represented by general formula (p2) shown below can also be used.

[Chemical Formula 5]

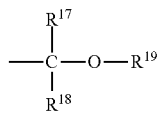

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of R17.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

As the structural unit (a1), it is preferable to use at least one member selected from the group consisting of structural units represented by formula (a1-0-1) shown below and structural units represented by formula (a1-0-2) shown below.

[Chemical Formula 6]

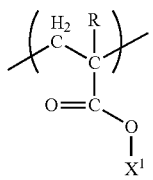

(a1-0-1)

In the formula, R represents a hydrogen atom, an alkyl group of 1 to 5 carbon atoms or a halogenated alkyl group of 1 to 5 carbon atoms; and $X^1$ represents an acid dissociable group.

[Chemical Formula 7]

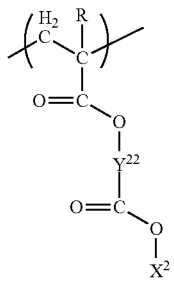

(a1-0-2)

In the formula, R represents a hydrogen atom, an alkyl group of 1 to 5 carbon atoms or a halogenated alkyl group of 1 to 5 carbon atoms; $X^2$ represents an acid dissociable group; and $Y^{22}$ represents a divalent linking group.

In general formula (a1-0-1) above, the alkyl group of 1 to 5 carbon atoms or halogenated alkyl group of 1 to 5 carbon atoms for R are the same as the alkyl group of 1 to 5 carbon atoms or halogenated alkyl group of 1 to 5 carbon atoms which can be used as the substituent for the hydrogen atom bonded to the carbon atom on the α-position of the aforementioned acrylate ester.

$X^1$ is not particularly limited as long as it is an acid dissociable group. Examples thereof include the aforementioned tertiary alkyl ester-type acid dissociable groups and acetal-type acid dissociable groups, and tertiary alkyl ester-type acid dissociable groups are preferable.

In general formula (a1-0-2), R is the same as defined above.
$X^2$ is the same as defined for $X^1$ in general formula (a1-0-1).

As preferable examples of the divalent linking group for $Y^{22}$, a divalent hydrocarbon group which may have a substituent, and a divalent linking group containing a hetero atom can be given.

A hydrocarbon "has a substituent" means that part or all of the hydrogen atoms within the hydrocarbon group is substituted with groups or atoms other than hydrogen.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

As specific examples of the aliphatic hydrocarbon group for the hydrocarbon group as $Y^{22}$, a linear or branched aliphatic hydrocarbon group, and an aliphatic hydrocarbon group having a ring in the structure thereof can be given.

The linear or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

As examples of the hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of the aforementioned aromatic hydrocarbon group for $Y^{22}$ include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group; an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

When $Y^{22}$ represents a divalent linking group containing a hetero atom, examples thereof include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O—, "-A-O—B— (wherein O is an oxygen atom, and each of A and B independently represents a divalent hydrocarbon group which may have a substituent)" and a combination of a divalent hydrocarbon group which may have a substituent with a divalent linking group containing a hetero atom. As examples of the divalent hydrocarbon group which may have a substituent, the same groups as those described above for the hydrocarbon group which may have a substituent can be given, and a linear or branched aliphatic hydrocarbon group or an aliphatic hydrocarbon group containing a ring in the structure thereof is preferable.

When $Y^{22}$ represents a divalent linking group —NH— and the H in the formula is replaced with a substituent such as an alkyl group or an acyl group, the substituent preferably has 1 to 10 carbon atoms, more preferably 1 to 8 carbon atoms, and most preferably 1 to 5 carbon atoms.

When $Y^{22}$ is "A-O—B", each of A and B independently represents a divalent hydrocarbon group which may have a substituent.

The hydrocarbon group for A may be either an aliphatic hydrocarbon group, or an aromatic hydrocarbon group. An "aliphatic hydrocarbon group" refers to a hydrocarbon group that has no aromaticity.

The aliphatic hydrocarbon group for A may be either saturated or unsaturated. In general, the aliphatic hydrocarbon group is preferably saturated.

As specific examples of the aliphatic hydrocarbon group for A, a linear or branched aliphatic hydrocarbon group, and an aliphatic hydrocarbon group having a ring in the structure thereof can be given. These are the same as defined above.

Among these, as A, a linear aliphatic hydrocarbon group is preferable, more preferably a linear alkylene group, still more preferably a linear alkylene group of 2 to 5 carbon atoms, and most preferably an ethylene group.

As the hydrocarbon group for B, the same divalent hydrocarbon groups as those described above for A can be used.

As B, a linear or branched aliphatic hydrocarbon group is preferable, and a methylene group or an alkylmethylene group is particularly desirable.

The alkyl group within the alkyl methylene group is preferably a linear alkyl group of 1 to 5 carbon atoms, more preferably a linear alkyl group of 1 to 3 carbon atoms, and most preferably a methyl group.

Specific examples of the structural unit (a1) include structural units represented by general formulas (a1-1) to (a1-4) shown below.

[Chemical Formula 8]

(a1-1)

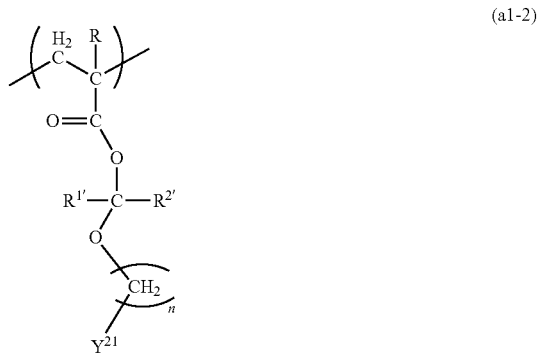
(a1-2)

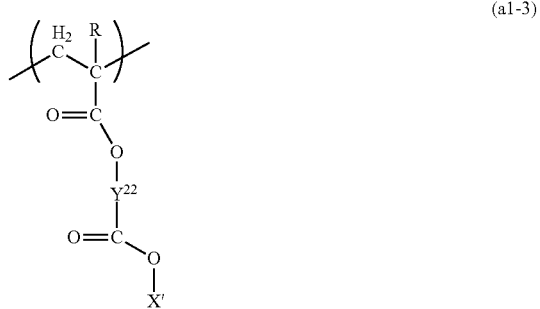
(a1-3)

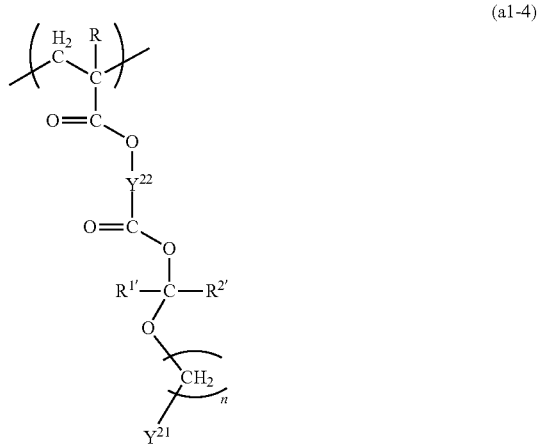
(a1-4)

In the formulas, X' represents a tertiary alkyl ester-type acid dissociable group; $Y^{21}$ represents an alkyl group of 1 to 5 carbon atoms or an aliphatic cyclic group; n represents an integer of 0 to 3; $Y^{22}$ represents a divalent linking group; R is the same as defined above; and each of $R^{1\prime}$ and $R^{2\prime}$ independently represents a hydrogen atom or an alkyl group of 1 to 5 carbon atoms.

Examples of the tertiary alkyl ester-type acid dissociable group for X' include the same tertiary alkyl ester-type acid dissociable groups as those described above for $X^1$.

$R^{1\prime}$, $R^{2\prime}$, n and $Y^{21}$ are respectively the same as defined for $R^{1\prime}$, $R^{2\prime}$, n and $Y^{21}$ in general formula (p1) described above in connection with the "acetal-type acid dissociable group".

As examples of $Y^{22}$, the same groups as those described above for $Y^{22}$ in general formula (a1-0-2) can be given.

Specific examples of structural units represented by general formula (a1-1) to (a1-4) are shown below.

In the formulas shown below, $R^\alpha$ represents a hydrogen atom, a methyl group or a trifluoromethyl group.

[Chemical Formula 9]

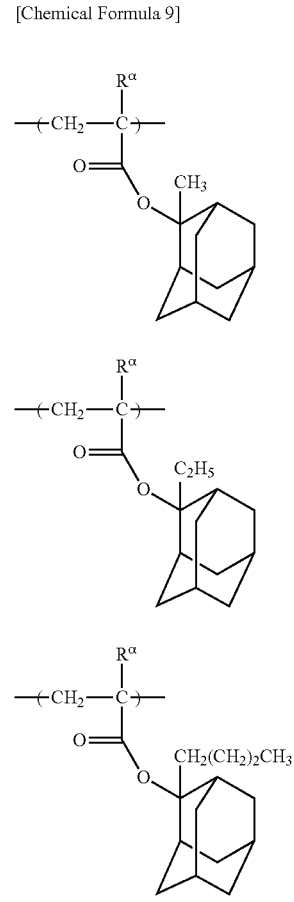

(a1-1-1)

(a1-1-2)

(a1-1-3)

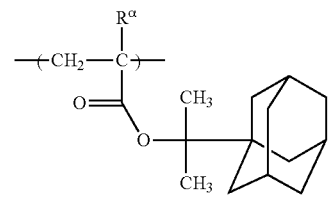

(a1-1-4)

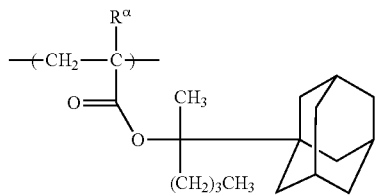

(a1-1-5)

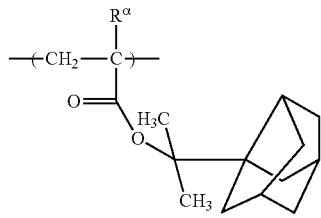

(a1-1-6)

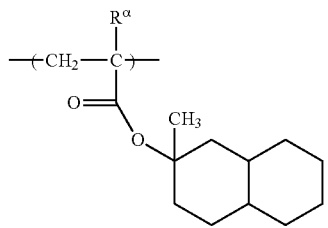

(a1-1-7)

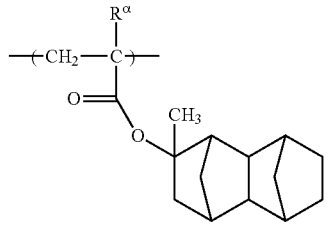

(a1-1-8)

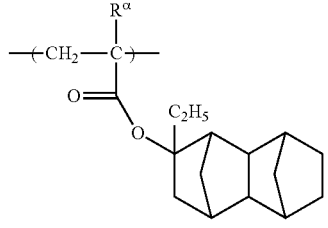

(a1-1-9)

[Chemical Formula 10]

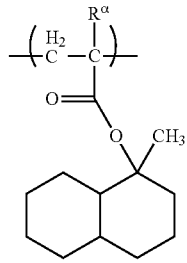

(a1-1-10)

(a1-1-11) 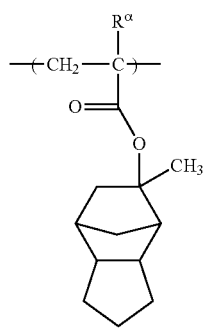
(a1-1-12) 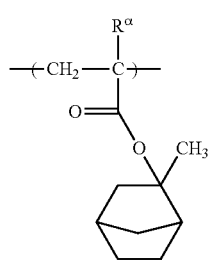
(a1-1-13) 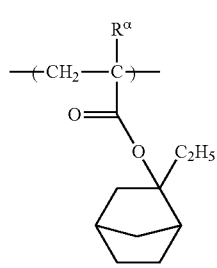
(a1-1-14) 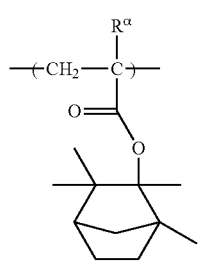
(a1-1-15) 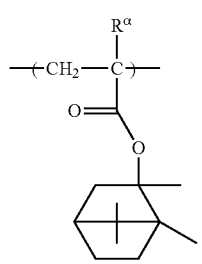
(a1-1-16) 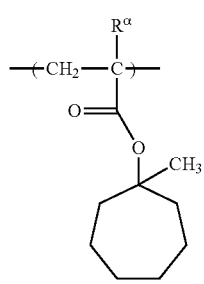
(a1-1-17) 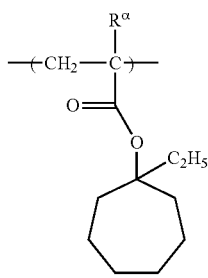
(a1-1-18) 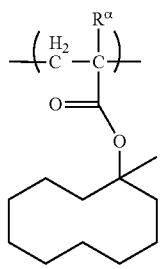
(a1-1-19) 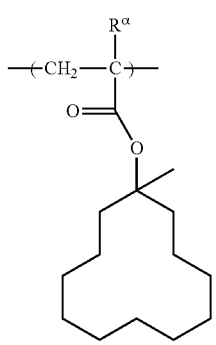
(a1-1-20) 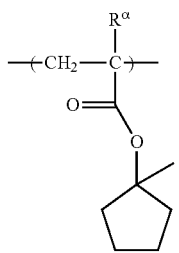
(a1-1-21) 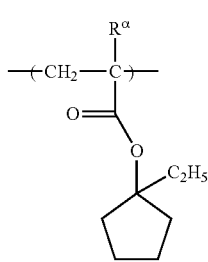

[Chemical Formula 11]
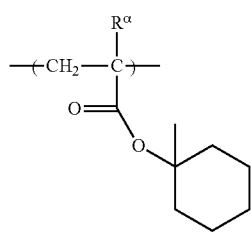 (a1-1-22)
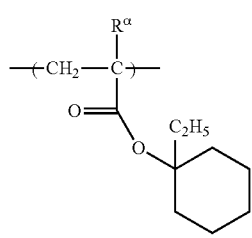 (a1-1-23)
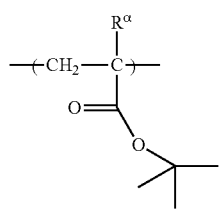 (a1-1-24)
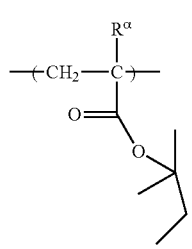 (a1-1-25)
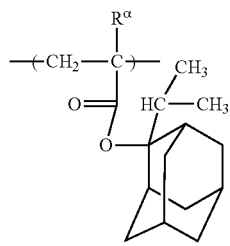 (a1-1-26)
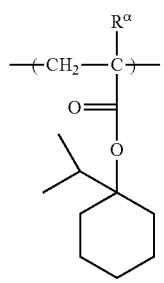 (a1-1-27)
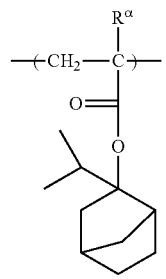 (a1-1-28)
(a1-1-29)
(a1-1-30)
(a1-1-31)
(a1-1-32)

[Chemical Formula 12]
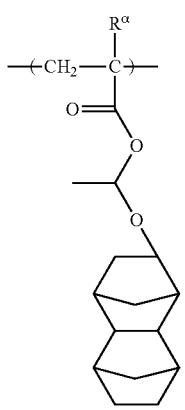
(a1-2-1)
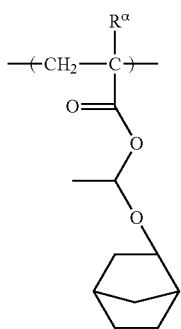
(a1-2-2)
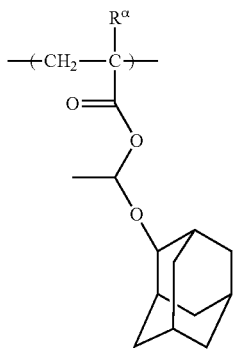
(a1-2-3)
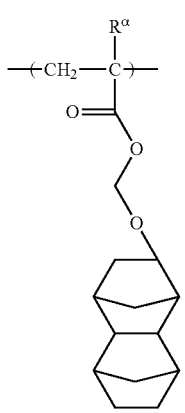
(a1-2-4)
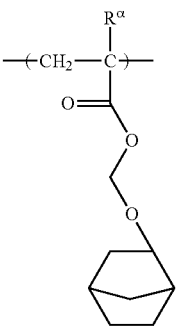
(a1-2-5)
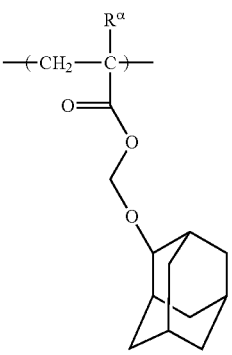
(a1-2-6)
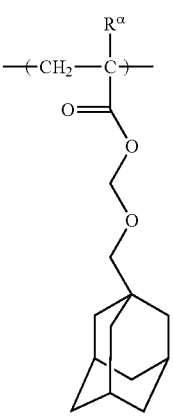
(a1-2-7)
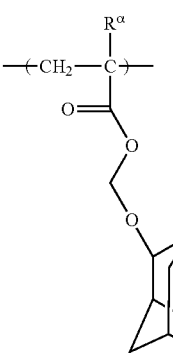
(a1-2-8)

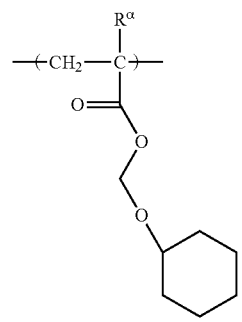
(a1-2-9)
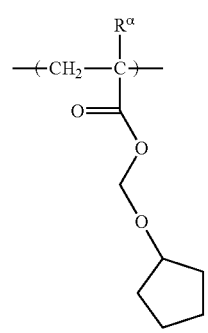
(a1-2-10)
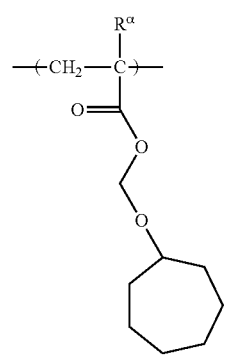
(a1-2-11)
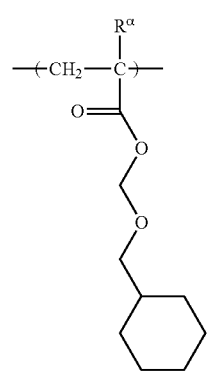
(a1-2-12)
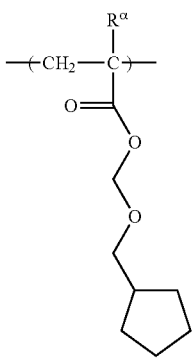
(a1-2-13)
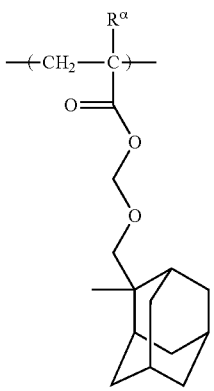
(a1-2-14)
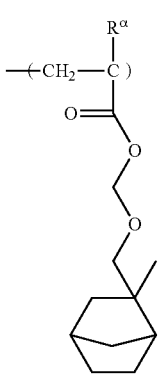
(a1-2-15)
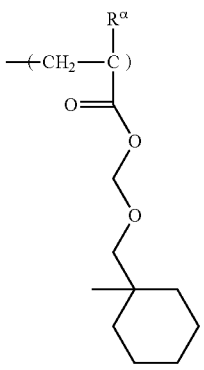
(a1-2-16)

(a1-2-17) 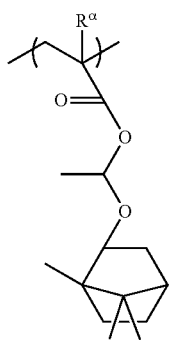
(a1-2-18) 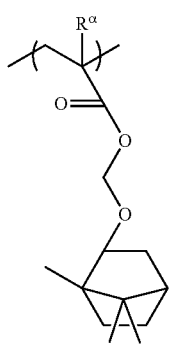
(a1-2-19) 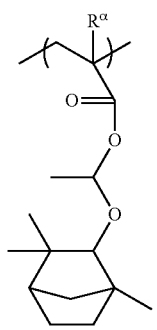
(a1-2-20) 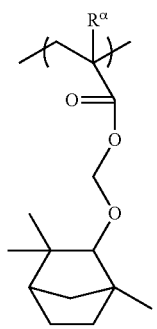
(a1-2-21) 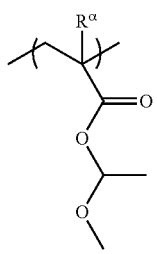
(a1-2-22) 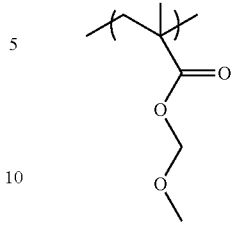
(a1-2-23) 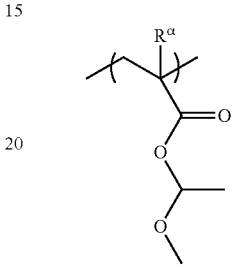
(a1-2-24) 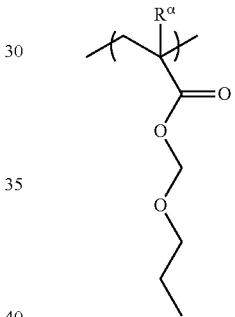
[Chemical Formula 13]
(a1-3-1) 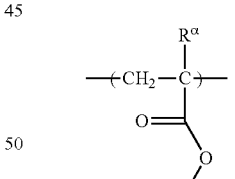
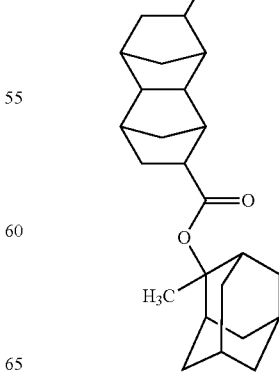

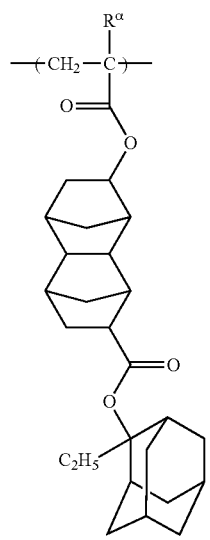 (a1-3-2)
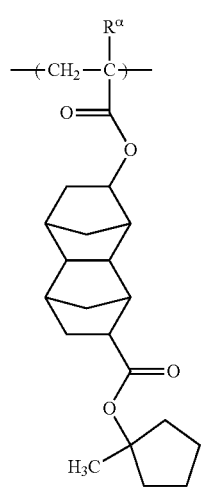 (a1-3-3)
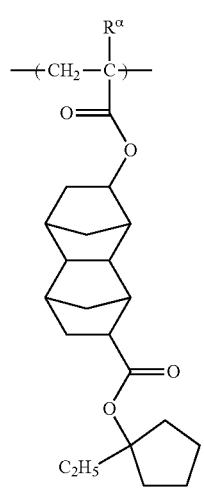 (a1-3-4)
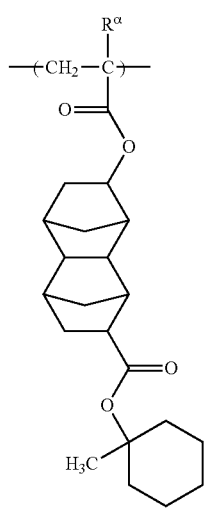 (a1-3-5)
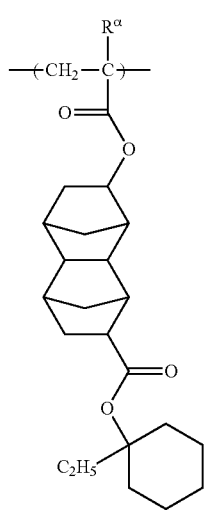 (a1-3-6)
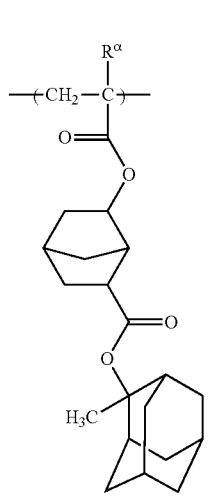 (a1-3-7)

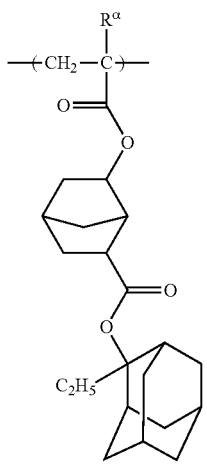
(a1-3-8)
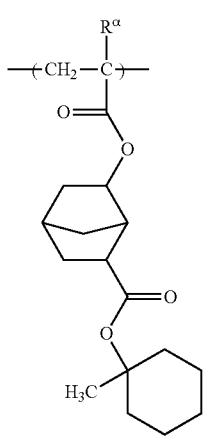
(a1-3-9)
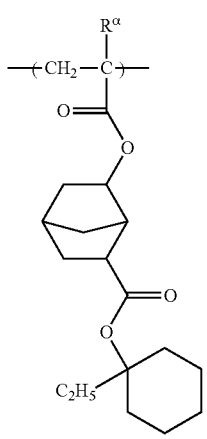
(a1-3-10)
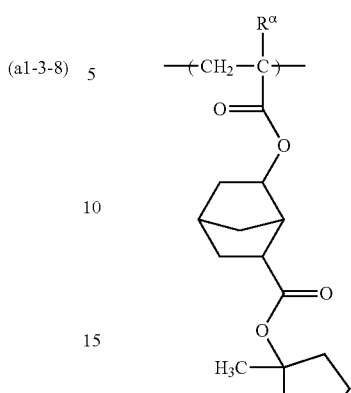
(a1-3-11)
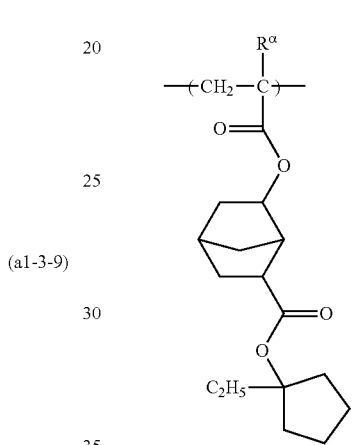
(a1-3-12)
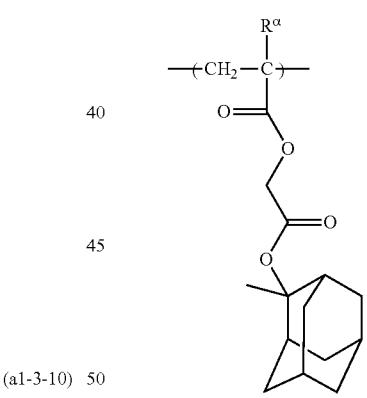
(a1-3-13)
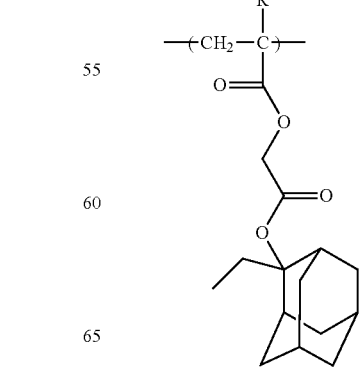
(a1-3-14)

(a1-3-15)
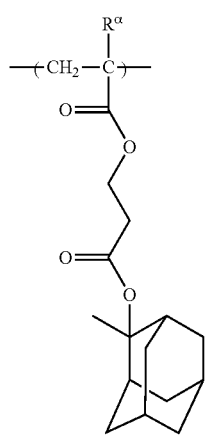
(a1-3-16)
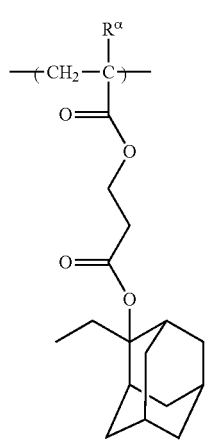
(a1-3-17)
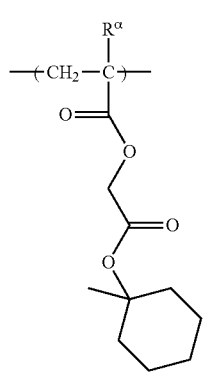
(a1-3-18)
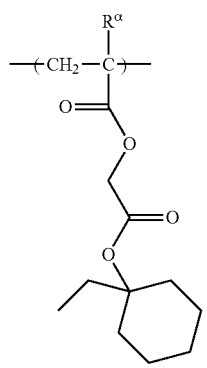
[Chemical Formula 14]
(a1-3-19)
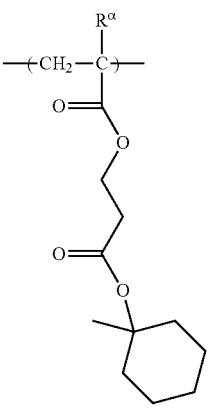
(a1-3-20)
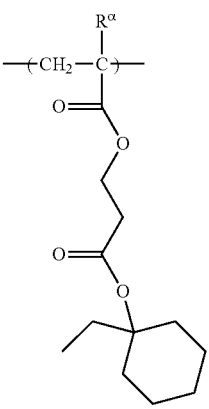
(a1-3-21)
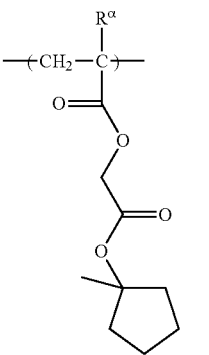
(a1-3-22)
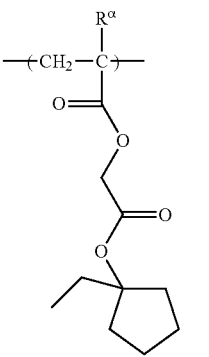

(a1-3-23) 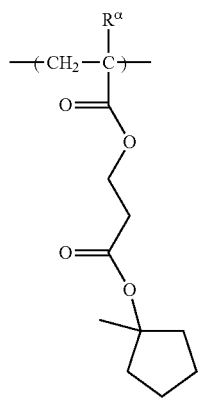
(a1-3-24) 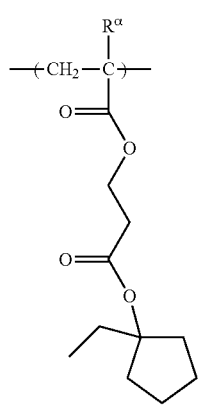
[Chemical Formula 15]
(a1-3-25) 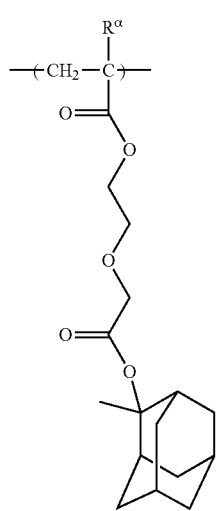
(a1-3-26) 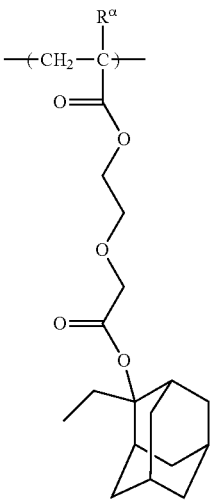
(a1-3-27) 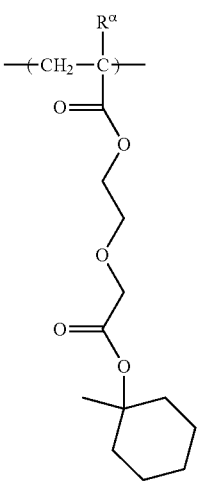
(a1-3-28) 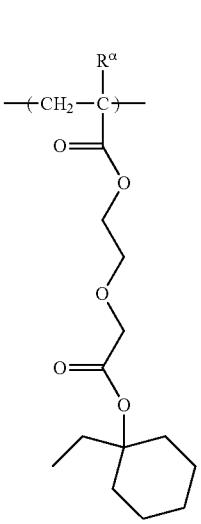

(a1-3-29)
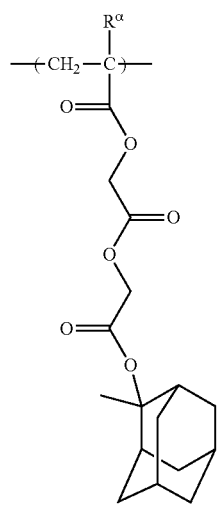
(a1-3-30)
(a1-3-31)
(a1-3-32)
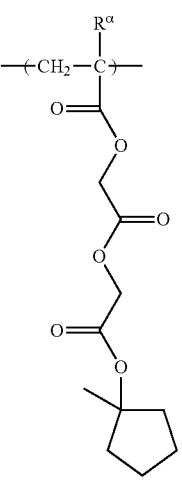
[Chemical Formula 16]
(a1-4-1)
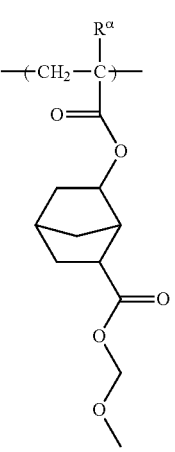
(a1-4-2)
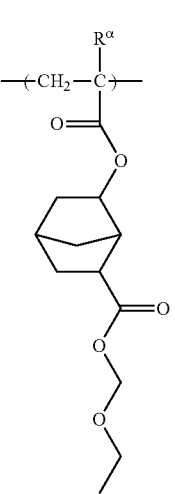
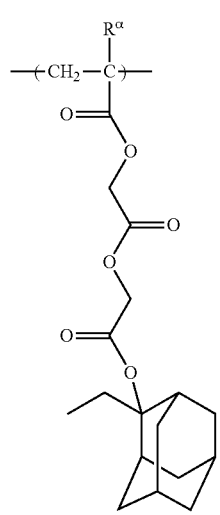

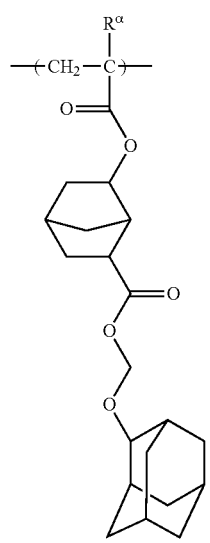 (a1-4-3)
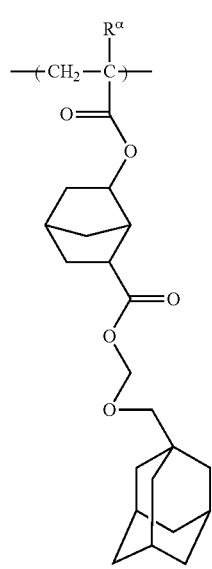 (a1-4-4)
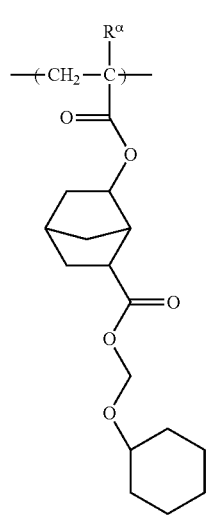 (a1-4-5)
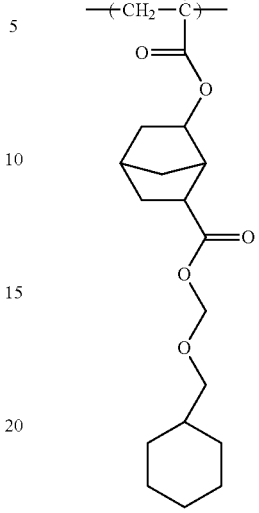 (a1-4-6)
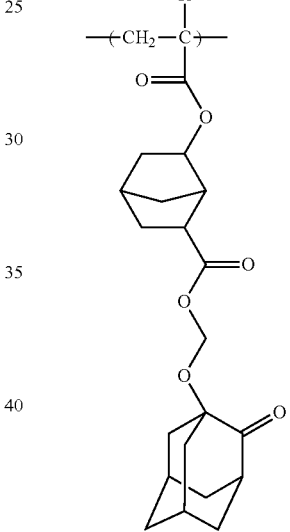 (a1-4-7)
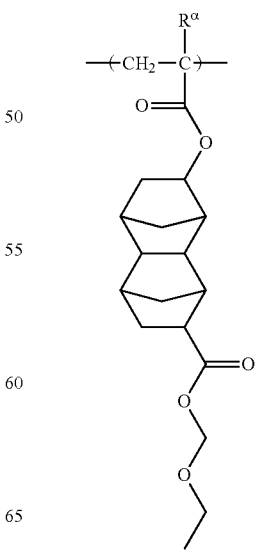 (a1-4-8)

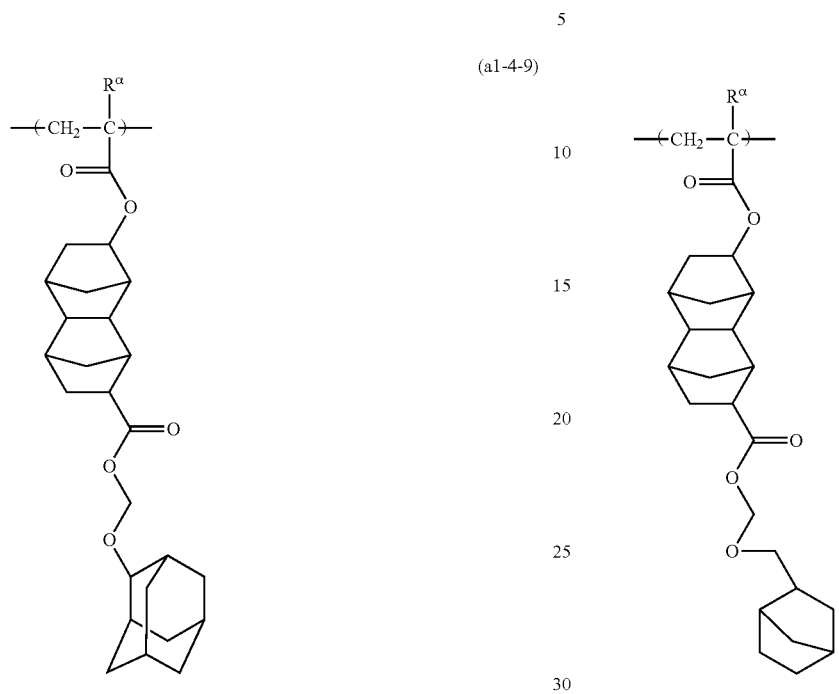
(a1-4-9)
(a1-4-11)
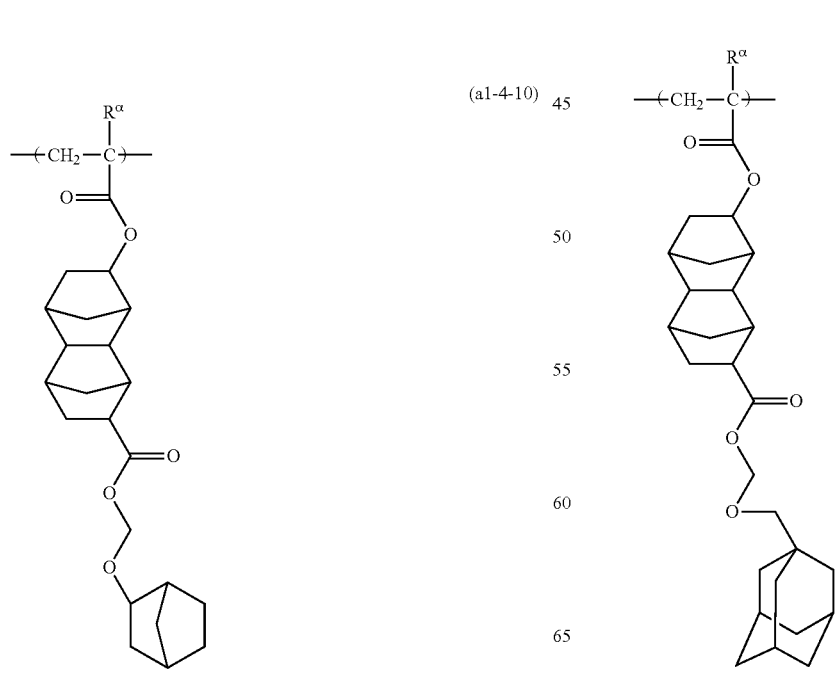
(a1-4-10)
(a1-4-12)

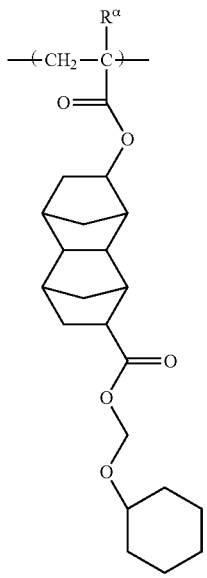
(a1-4-13)

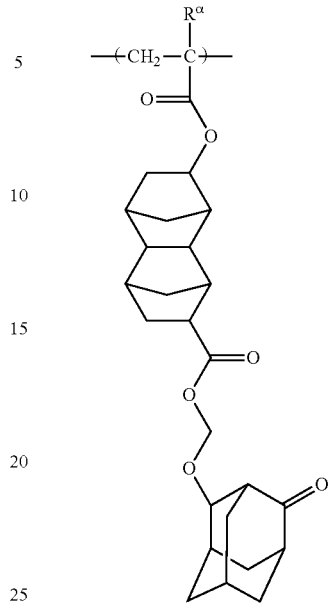
(a1-4-15)

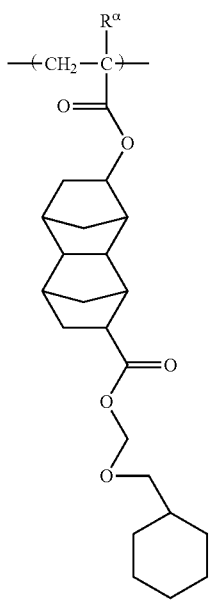
(a1-4-14)

As the structural unit (a1), structural units represented by general formula (a1-1), (a1-2) or (a1-3) are preferable. More specifically, at least one structural unit selected from the group consisting of structural units represented by formulas (a1-1-1) to (a-1-1-4), (a1-1-20) to (a1-1-23), (a1-2-1) to (a1-2-24) and (a1-3-25) to (a1-3-28) is more preferable.

Further, as the structural unit (a1), structural units represented by general formula (a1-1-01) shown below which includes the structural units represented by formulas (a1-1-1) to (a1-1-3) and (a1-1-26), structural units represented by general formula (a1-1-02) shown below which includes the structural units represented by formulas (a1-1-16), (a1-1-17), (a1-1-20) to (a1-1-23) and (a1-1-32), structural units represented by general formula (a1-3-01) shown below which include the structural units represented by formulas (a1-3-25) and (a1-3-26), structural units represented by general formula (a1-3-02) shown below which include the structural units represented by formulas (a1-3-27) and (a1-3-28), and structural units represented by general formula (a1-3-03) shown below which include the structural units represented by formulas (a1-3-29) and (a1-3-30) are also preferable.

[Chemical Formula 17]

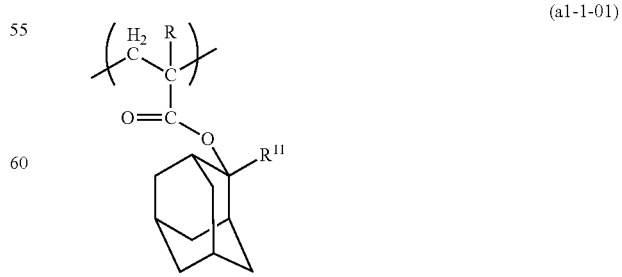
(a1-1-01)

-continued (a1-1-02)

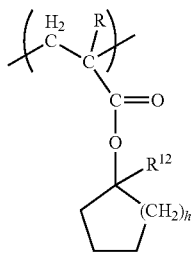

In the formulas, each R independently represents a hydrogen atom, an alkyl group of 1 to 5 carbon atoms or a halogenated alkyl group of 1 to 5 carbon atoms; represents an alkyl group of 1 to 5 carbon atoms; $R^{12}$ represents an alkyl group of 1 to 7 carbon atoms; and h represents an integer of 1 to 6.

In general formula (a1-1-01), R is the same as defined above. The alkyl group of 1 to 5 carbon atoms for $R^{11}$ is the same as defined for the alkyl group of 1 to 5 carbon atoms for R, and a methyl group, an ethyl group or an isopropyl group is preferable.

In general formula (a1-1-02), R is the same as defined above. The alkyl group of 1 to 5 carbon atoms for $R^{12}$ is the same as defined for the alkyl group of 1 to 5 carbon atoms for R, and a methyl group, an ethyl group or an isopropyl group is preferable. h is preferably 1 or 2, and most preferably 2.

[Chemical Formula 18]

(a1-3-01)

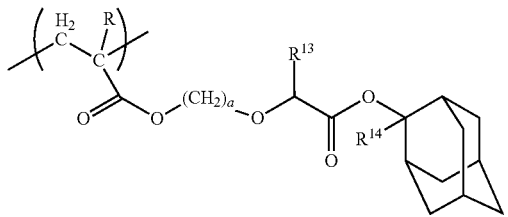

In the formula, R represents a hydrogen atom, an alkyl group of 1 to 5 carbon atoms or a halogenated alkyl group of 1 to 5 carbon atoms; $R^{14}$ is the same as defined above; $R^{13}$ represents a hydrogen atom or a methyl group; and a represents an integer of 1 to 10.

[Chemical Formula 19]

(a1-3-02)

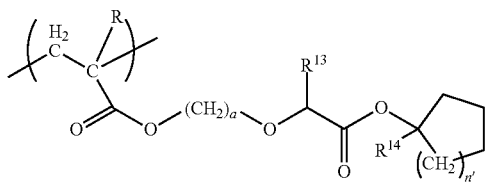

In the formula, R represents a hydrogen atom, an alkyl group of 1 to 5 carbon atoms or a halogenated alkyl group of 1 to 5 carbon atoms; $R^{14}$ is the same as defined above; $R^{13}$ represents a hydrogen atom or a methyl group; a represents an integer of 1 to 10; and n' represents an integer of 1 to 6.

[Chemical Formula 20]

(a1-3-03)

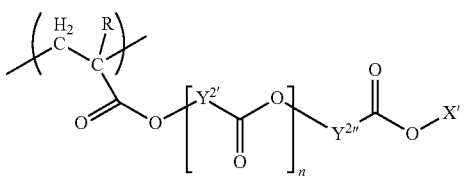

In the formula, R is the same as defined above; each of $Y^{2'}$ and $Y^{2''}$ independently represents a divalent linking group; X' represents an acid dissociable group; and n represents an integer of 0 to 3.

In general formulas (a1-3-01) to (a1-3-03), R is the same as defined above.

$R^{13}$ is preferably a hydrogen atom.

n' is preferably 1 or 2, and most preferably 2.

a is preferably an integer of 1 to 8, more preferably an integer of 2 to 5, and most preferably 2.

As the divalent linking group for $Y^{2'}$ and $Y^{2''}$, the same groups as those described above for $Y^{22}$ in general formula (a1-3) can be used.

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable group for X', the same groups as those described above can be used. X' is preferably a tertiary alkyl ester-type acid dissociable group, more preferably the aforementioned group which has a tertiary carbon atom on the ring structure of a cyclic alkyl group. Among the aforementioned groups, groups represented by the aforementioned general formulas (1-1) to (1-9) are preferable.

n represents an integer of 0 to 3, preferably an integer of 0 to 2, more preferably 0 or 1, and most preferably 1.

Furthermore, as the structural unit (a1), a structural unit (a1-5) represented by general formula (a1-5) is also preferable.

[Chemical Formula 21]

(a1-5)

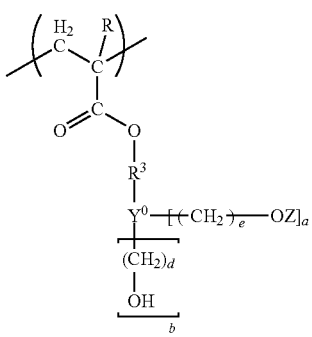

In the formula, R represents a hydrogen atom, an alkyl group of 1 to 5 carbon atoms or a halogenated alkyl group of 1 to 5 carbon atoms; $R^3$ represents a single bond or a divalent linking group; $Y^0$ represents an aliphatic hydrocarbon group which may have a substituent; OZ represents an acid decomposable group; a represents an integer of 1 to 3 and b represents an integer of 0 to 2, provided that a+b=1 to 3; and each of d and e independently represents an integer of 0 to 3.

In formula (a1-5), R is the same as defined above. As R, a hydrogen atom or a methyl group is preferable.

In formula (a1-5), $R^3$ represents a single bond or a divalent linking group. Examples of the divalent linking group for $R^3$ include the same divalent linking groups as those described above for $Y^{22}$ in the aforementioned formula (a1-0-2).

In formula (a1-5), $Y^0$ represents an aliphatic cyclic group. The term "aliphatic cyclic group" refers to a monocyclic group or polycyclic group that has no aromaticity.

The "aliphatic cyclic group" within the structural unit (a1-5) may or may not have a substituent. Examples of the substituent include an alkyl group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents (aliphatic ring) is not limited to be constituted from only carbon and hydrogen (not limited to hydrocarbon rings), and the ring (aliphatic ring) may contain an oxygen atom in the structure thereof. Further, the "hydrocarbon ring" may be either saturated or unsaturated, but is preferably saturated.

The aliphatic cyclic group may be either a polycyclic group or a monocyclic group. Examples of aliphatic cyclic groups include groups in which two or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group. Specific examples include groups in which two or more hydrogen atoms have been removed from a monocycloalkane such as cyclopentane or cyclohexane; and groups in which two or more hydrogen atoms have been removed from a polycycloalkane such as adamantane, norbornane, isobornane, tricyclodecane or tetracyclododecane.

Further examples of the aliphatic cyclic group include groups in which two or more hydrogen atoms have been removed from tetrahydrofuran or tetrahydropyran which may or may not be substituted with an alkyl group of 1 to 5 carbon atoms, a fluorine atom or a fluorinated alkyl group.

The aliphatic cyclic group within the structural unit (a1-5) is preferably a polycyclic group, and a group in which two or more hydrogen atoms have been removed from adamantane is particularly desirable.

In the aforementioned formula (a1-5), OZ represents an acid decomposable group.

As the acid decomposable group for OZ, an acid decomposable group which is decomposed to form a hydroxy group (—OH) is preferable, and examples thereof include (1) a group in which a hydroxy group is protected with an acetal-type acid dissociable group Z, and (2) a group in which Z has a tertiary ester-type acid dissociable group within the structure thereof, and is further decomposed by a decarboxylation reaction after the acid dissociation.

The acetal-type acid dissociable group for Z within (1) "a group in which a hydroxy group is protected with an acetal-type acid dissociable group" is the same as defined above. As Z for the group (1), a 1-n-butoxyethyl group (—CH(CH$_3$)—O—C$_4$H$_9$) or an n-butoxymethyl group (—CH$_2$—O—C$_4$H$_9$) is particularly desirable.

The oxygen atom within OZ is derived from the hydroxy group protected with the acetal-type acid dissociable group, and by the action of an acid, the bond between the oxygen atom and the acetal-type acid dissociable group is broken, so as to form a hydroxy group (—OH) which is a polar group on the terminal of the structural unit.

In the (2) "group in which Z has a tertiary ester-type acid dissociable group within the structure thereof, and is further decomposed by a decarboxylation reaction after the acid dissociation", the tertiary ester-type acid dissociable group is as described above, and the tertiary ester-type acid dissociable group is eliminated and carbon dioxide is generated, so as to form a hydroxy group (—OH) which is a polar group on the terminal of the structural unit.

The alkyl group within the tertiary ester-type acid dissociable group for Z in OZ may be either an alkyl group which does not have a ring structure (chain-like structure), or an alkyl group having a ring structure.

In the case of a chain-like alkyl group, as Z for OZ, a chain-like tertiary alkyloxycarbonyl group represented by general formula (II) shown below can be mentioned.

In formula (II), each of $R^{21}$ to $R^{23}$ independently represents a linear or branched alkyl group. The number of carbon atoms within the alkyl group is preferably from 1 to 5, and more preferably from 1 to 3.

Further, in the group represented by —C($R^{21}$)($R^{22}$)($R^{23}$) in general formula (II), the total number of carbon atoms is preferably from 4 to 7, more preferably from 4 to 6, and most preferably 4 or 5.

Preferable examples of the group represented by —C($R^{21}$)($R^{22}$)($R^{23}$) in general formula (II) include a tert-butyl group and a tert-pentyl group, and a tert-butyl group is more preferable. That is, in such a case, as Z, a tert-butyloxycarbonyl group (t-boc) and a tert-pentyloxycarbonyl group are preferable.

[Chemical Formula 22]

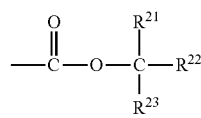

(II)

Furthermore, in the case where the acid decomposable group OZ is (3) a group which does not form a hydroxy group (—OH) after being decomposed (e.g., a group which forms a carboxy group), as Z for OZ, a tertiary alkyloxycarbonylalkyl group represented by general formula (III) shown below is preferable.

In general formula (III), $R^{21}$ to $R^{23}$ are the same as defined for $R^{21}$ to $R^{23}$ in general formula (II).

f represents an integer of 1 to 3, and is preferably 1 or 2.

As the chain-like tertiary alkyloxycarbonylalkyl group, a tert-butyloxycarbonylmethyl group and a tert-butyloxycarbonylethyl group are preferable.

Among these, as the tertiary alkyl group-containing group which does not have a ring structure, a tertiary alkyloxycarbonyl group or a tertiary alkyloxycarbonylalkyl group is preferable, a tertiary alkyloxycarbonyl group is more preferable, and a tert-butyloxycarbonyl group (t-boc) is most preferable.

[Chemical Formula 23]

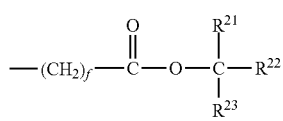

(III)

In the case where Z is a group having in the structure thereof a tertiary alkyl ester-type acid dissociable group containing a ring structure, as examples of Z for OZ, groups in which the terminal oxygen atom of —C(=O)—O— or —(CH$_2$)$_1$—C(=O)—O— (f is the same as defined for f in formula (III)) has bonded thereto a group represented by any of the aforementioned formulae (1-1) to (1-9) and (2-1) to (2-6) can be given.

Among the above examples, as OZ, a group (1) or (2) which forms a hydroxy group (—OH) after being decomposed is preferable, a group in which Z is a group represented by the aforementioned general formula (II) is more preferable, and a group in which Z represents a tert-butyloxycarbonyl group (t-boc) or a 1,1-dimethylpropoxycarbonyl group is most preferable.

In general formula (a1-5), a represents an integer of 1 to 3, and b represents an integer of 0 to 2, provided that a+b=1 to 3.

a is preferably 1 or 2, and more preferably 1.

b is preferably 0.

a+b is preferably 1 or 2, and more preferably 1.

d represents an integer of 0 to 3, preferably 0 or 1, and more preferably 0.

e represents an integer of 0 to 3, preferably 0 or 1, and more preferably 0.

When b is 1 or more, the structural unit (a1-5) falls under the definition of the structural unit (a3) described later. However, a structural unit represented by general formula (a1-5) is regarded as a structural unit (a1-5), and not as a structural unit (a3).

In particular, as the structural unit (a1-5), a structural unit represented by general formula (a11-1-1), (a11-1-2) or (a11-2) shown below is preferable, and a structural unit represented by general formula (a11-1-1) is more preferable.

[Chemical Formula 24]

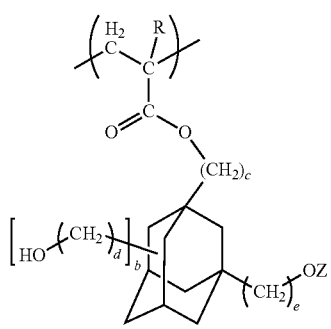

(a11-1-1)

In the formula, R, Z, b, c, d and e are the same as defined above.

[Chemical Formula 25]

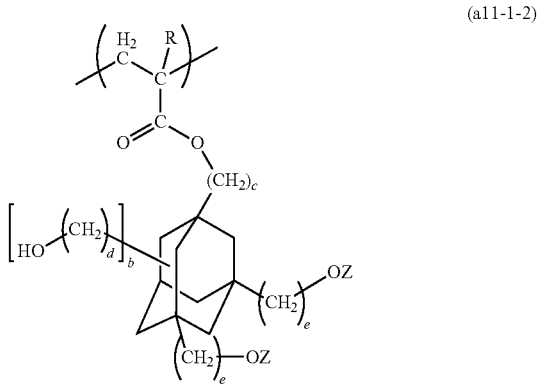

(a11-1-2)

In the formula, R, Z, b, c, d and e are respectively the same as defined above, and the plurality of e and Z may be the same or different from each other.

[Chemical Formula 26]

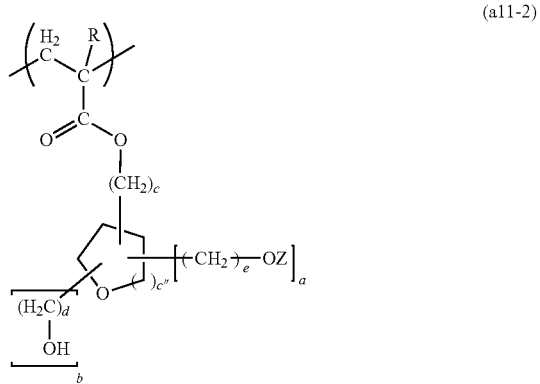

(a11-2)

In the formula, R, Z, a, b, c, d and e are the same as defined above; and C" represents an integer of 1 to 3.

In formula (a11-2), c" represents an integer of 1 to 3, preferably 1 or 2, and still more preferably 1.

When c represents 0 in formula (a11-2), the oxygen atom on the terminal of the carbonyloxy group within the acrylate ester is preferably not bonded to the carbon atom which is bonded to the oxygen atom within the cyclic group. That is, when c represents 0, it is preferable that there are at least two carbon atoms present between the terminal oxygen atom and the oxygen atom within the cyclic group (excluding the case where the number of such carbon atom is one (i.e., the case where an acetal bond is formed)).

A monomer for deriving the structural unit (a11-1) can be synthesized, for example, by protecting part or all of the hydroxyl groups within a compound represented by general formula (a11-0) shown below (namely, an acrylate ester containing an aliphatic cyclic group having 1 to 3 alcoholic hydroxyl groups) with alkoxyalkyl groups the aforementioned Z by a conventional method.

[Chemical Formula 27]

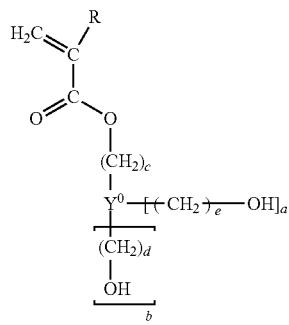

In the formula, R, $Y^0$, a, b, c, d and e are the same as defined above.

In the component (A1), the amount of the structural unit (a1) based on the combined total of all structural units constituting the component (A1) is preferably 5 to 90 mol %, more preferably 10 to 85 mol %, and still more preferably 15 to 80 mol %. When the amount of the structural unit (a1) is at least as large as the lower limit of the above-mentioned range, a pattern can be easily formed using a resist composition prepared from the component (A1). On the other hand, when the amount of the structural unit (a1)) is no more than the upper limit of the above-mentioned range, a good balance can be achieved with the other structural units.

(Structural Unit (a2))

The structural unit (a2) is at least one structural unit selected from the group consisting of a structural unit derived from an acrylate ester which may have the hydrogen atom bonded to the carbon atom on the α-position substituted with a substituent and contains an —$SO_2$— containing cyclic group (hereafter, referred to as "structural unit (a2$^S$)"), and a structural unit derived from an acrylate ester which may have the hydrogen atom bonded to the carbon atom on the α-position substituted with a substituent and contains a lactone-containing cyclic group (hereafter, referred to as "structural unit (a2$^L$)").

By virtue of the structural unit (a2) containing a —$SO_2$— containing cyclic group or a lactone-containing cyclic group, a resist composition containing the component (A1) including the structural unit (a2) is capable of improving the adhesion of a resist film to a substrate, and increasing the compatibility with the developing solution containing water (especially in the case of alkali developing process), thereby contributing to improvement of lithography properties.

Structural Unit (a2$^S$):

The structural unit (a2$^S$) is a structural unit derived from an acrylate ester containing a —$SO_2$— containing cyclic group and which may have the hydrogen atom bonded to the carbon atom on the α-position substituted with a substituent.

Here, an "—$SO_2$— containing cyclic group" refers to a cyclic group having a ring containing —$SO_2$— within the ring structure thereof, i.e., a cyclic group in which the sulfur atom (S) within —$SO_2$— forms part of the ring skeleton of the cyclic group. The ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings. The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable.

The —$SO_2$— containing cyclic group preferably has 3 to 30 carbon atoms, more preferably 4 to 20, still more preferably 4 to 15, and most preferably 4 to 12. Herein, the number of carbon atoms refers to the number of carbon atoms constituting the ring skeleton, excluding the number of carbon atoms within a substituent.

The —$SO_2$— containing cyclic group may be either a —$SO_2$— containing aliphatic cyclic group or a —$SO_2$— containing aromatic cyclic group. A —$SO_2$— containing aliphatic cyclic group is preferable.

Examples of the —$SO_2$— containing aliphatic cyclic group include aliphatic cyclic groups in which part of the carbon atoms constituting the ring skeleton has been substituted with a —$SO_2$— group or a —O—$SO_2$— group and has at least one hydrogen atom removed from the aliphatic hydrocarbon ring. Specific examples include an aliphatic hydrocarbon ring in which a —$CH_2$— group constituting the ring skeleton thereof has been substituted with a —$SO_2$— group and has at least one hydrogen atom removed therefrom; and an aliphatic hydrocarbon ring in which a —$CH_2$—$CH_2$— group constituting the ring skeleton has been substituted with a —O—$SO_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —$SO_2$— containing cyclic group may have a substituent. Examples of the substituent include an alkyl group, an alkoxy group, a halogen atom, a halogenated alkyl group, a hydroxy group, an oxygen atom (=O), —OC(=O)R", a hydroxyalkyl group and a cyano group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear or branched alkoxy group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of the —SO$_2$— containing cyclic group include groups represented by general formulas (3-1) to (3-4) shown below.

[Chemical Formula 28]

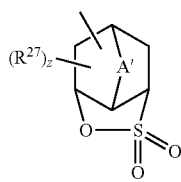

(3-1)

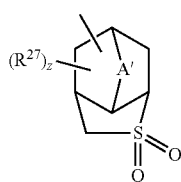

(3-2)

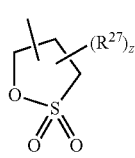

(3-3)

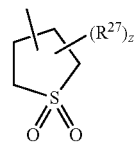

(3-4)

In the formulas, A' represents an oxygen atom, a sulfur atom or an alkylene group of 1 to 5 carbon atoms which may contain an oxygen atom or a sulfur atom; z represents an integer of 0 to 2; and R$^{27}$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, —CH$_2$—S—CH$_2$—.

As A', an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

When z is 2, the plurality of R$^{27}$ may be the same or different from each other.

As the alkyl group, alkoxy group, halogenated alkyl group, —COOR", —OC(=O)R" and hydroxyalkyl group for R$^{27}$, the same alkyl groups, alkoxy groups, halogenated alkyl groups, —COOR", —OC(=O)R" and hydroxyalkyl groups as those described above as the substituent for the —SO$_2$— containing cyclic group can be mentioned.

Specific examples of the cyclic groups represented by general formulas (3-1) to (3-4) are shown below. In the formulas shown below, "Ac" represents an acetyl group.

[Chemical Formula 29]

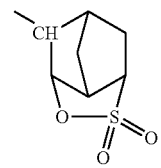

(3-1-1)

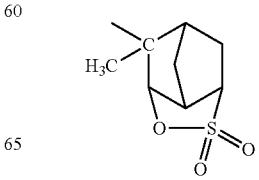

(3-1-2)

(3-1-3)
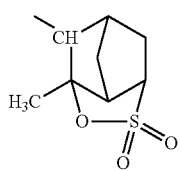
(3-1-4)
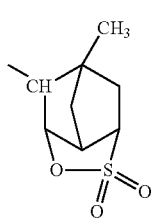
(3-1-5)
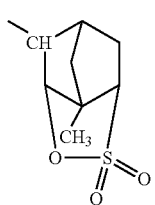
(3-1-6)
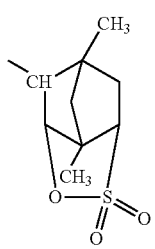
(3-1-7)
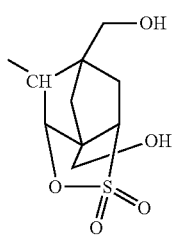
(3-1-8)
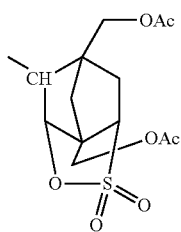
(3-1-9)
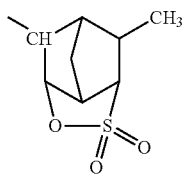
(3-1-10)
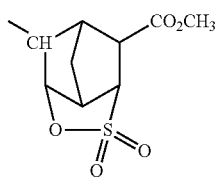
(3-1-11)
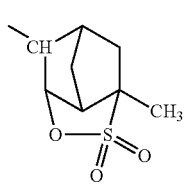
(3-1-12)
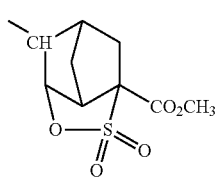
[Chemical Formula 30]
(3-1-13)
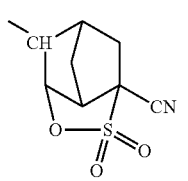
(3-1-14)
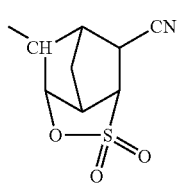
(3-1-15)
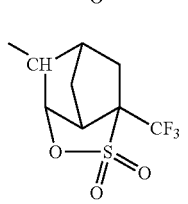
(3-1-16)
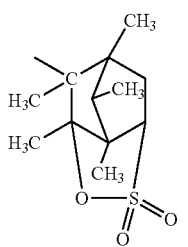
(3-1-17)

[Chemical Formula 31]
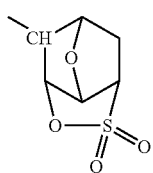 (3-1-18)
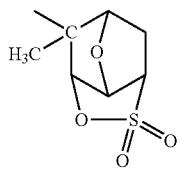 (3-1-19)
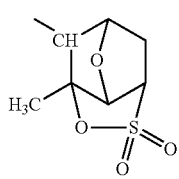 (3-1-20)
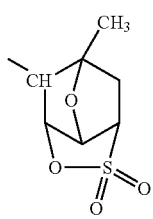 (3-1-21)
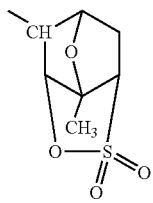 (3-1-22)
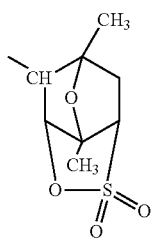 (3-1-23)
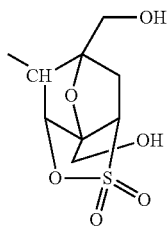 (3-1-24)
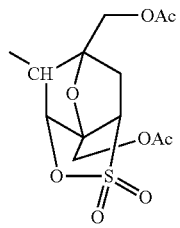 (3-1-25)
[Chemical Formula 32]
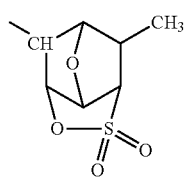 (3-1-26)
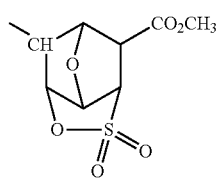 (3-1-27)
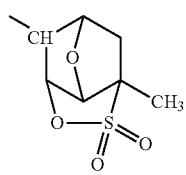 (3-1-28)
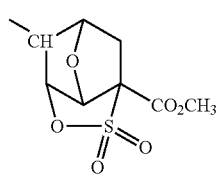 (3-1-29)
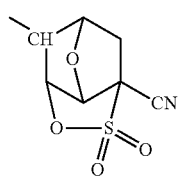 (3-1-30)
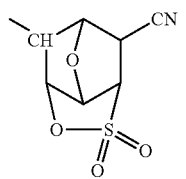 (3-1-31)
(3-1-32)

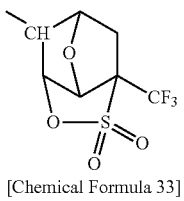

[Chemical Formula 33]

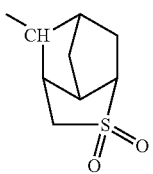

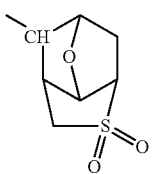

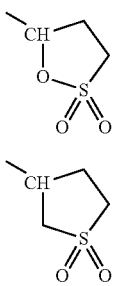

As the —SO$_2$— containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by chemical formula (3-1-1) is most preferable.

More specific examples of the structural unit (a2$^S$) include structural units represented by general formula (a2-0) shown below.

[Chemical Formula 34]

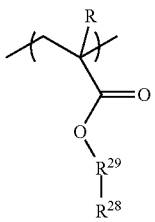

In the formula, R represents a hydrogen atom, an alkyl group of 1 to 5 carbon atoms or a halogenated alkyl group of 1 to 5 carbon atoms; R$^{28}$ represents a —SO$_2$— containing cyclic group; and R$^{29}$ represents a single bond or a divalent linking group.

In genera formula (a2-0), R is the same as defined above.

R$^{28}$ is the same as defined for the aforementioned —SO$_2$— containing group.

R$^{29}$ may be either a single bond or a divalent linking group, but a divalent linking group is preferable.

The divalent linking group for R$^{29}$ is not particularly limited, and examples thereof include the same divalent linking groups as those described above for Y$^{22}$ in the aforementioned formula (a1-0-2). Among these, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above for the aliphatic hydrocarbon group represented by Y$^{22}$.

As the divalent linking group containing an ester bond, a group represented by general formula: —R$^{30}$—C(=O)—O— (in the formula, R$^{30}$ represents a divalent linking group) is particularly desirable. That is, the structural unit (a2$^S$) is preferably a structural unit represented by general formula (a2-0-1) shown below.

[Chemical Formula 35]

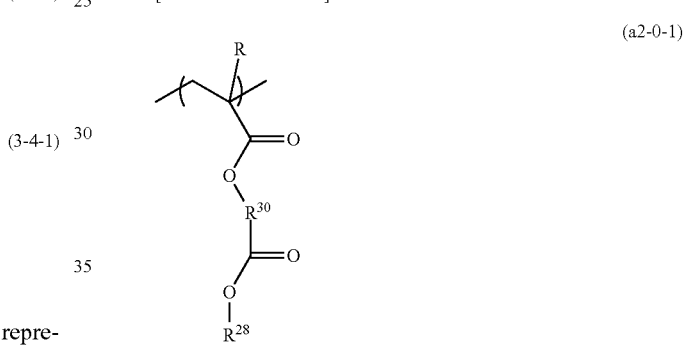

In the formula, R and R$^{28}$ are the same as defined above; and R$^{30}$ represents a divalent linking group.

R$^{30}$ is not particularly limited, and examples thereof include the same divalent linking groups as those described above for Y$^{22}$ in the aforementioned formula (a1-0-2).

As the divalent linking group for R$^{30}$, an alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene group, cyclic aliphatic hydrocarbon group and divalent linking group containing a hetero atom as those described above for Y$^{22}$ can be mentioned.

Among these, a linear or branched alkylene group, or a divalent linking group containing an oxygen atom as a hetero atom is more preferable.

As the linear alkylene group, a methylene group or an ethylene group is preferable, and a methylene group is particularly desirable.

As the branched alkylene group, an alkylmethylene group or an alkylethylene group is preferable, and —CH(CH$_3$)—, —C(CH$_3$)$_2$— or —C(CH$_3$)$_2$CH$_2$— is particularly desirable.

As the divalent linking group containing a hetero atom, a divalent linking group containing an ether bond or an ester bond is preferable, and a group represented by the aforementioned formula -A-O—B—, -[A-C(=O)—O]$_m$—B— or -A-O—C(=O)—B— is more preferable.

Among these, a group represented by the formula -A-O—C(=O)—B— is preferable, and a group represented by the formula: —$(CH_2)_{c1}$—C(=O)—O—$(CH_2)_{d1}$— is particularly desirable. c1 represents an integer of 1 to 5, and preferably 1 or 2. d1 represents an integer of 1 to 5, and preferably 1 or 2.

In particular, as the structural unit ($a2^5$), a structural unit represented by general formula (a0-1-11) or (a0-1-12) shown below is preferable, and a structural unit represented by general formula (a0-1-12) shown below is more preferable.

[Chemical Formula 36]

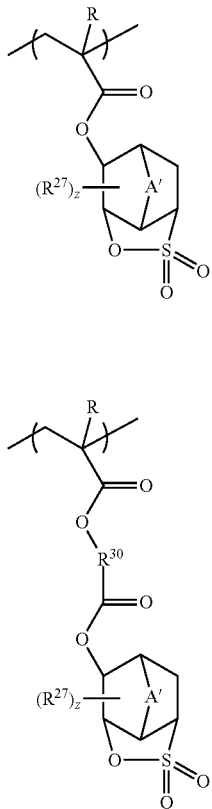

(a0-1-11)

(a0-1-12)

In the formulas, R, A', $R^{27}$, z and $R^{30}$ are the same as defined above.

In general formula (a0-1-11), A' is preferably a methylene group, an oxygen atom (—O—) or a sulfur atom (—S—).

As $R^{30}$, a linear or branched alkylene group or a divalent linking group containing an oxygen atom is preferable. As the linear or branched alkylene group and the divalent linking group containing an oxygen atom represented by $R^{30}$, the same linear or branched alkylene groups and the divalent linking groups containing an oxygen atom as those described above can be mentioned.

As the structural unit represented by general formula (a0-1-12), a structural unit represented by general formula (a0-1-12a) or (a0-1-12b) shown below is particularly desirable.

[Chemical Formula 37]

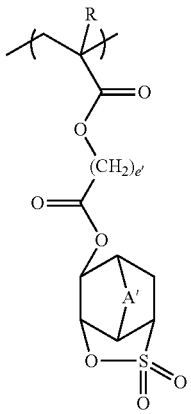

(a0-1-12a)

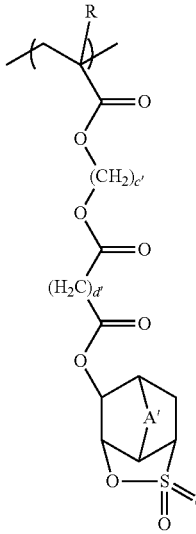

(a0-1-12b)

In the formulas, R and A' are the same as defined above; and each of c' to e' independently represents an integer of 1 to 3.

Structural Unit ($a2^L$):

The structural unit ($a2^L$) is a structural unit derived from an acrylate ester which may have the hydrogen atom bonded to the carbon atom on the α-position substituted with a substituent and contains a lactone-containing cyclic group.

The term "lactone-containing cyclic group" refers to a cyclic group including a ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for the structural unit ($a2^L$) is not particularly limited, and an arbitrary structural unit may be used. Specific examples of lactone-containing monocyclic groups include a group in which one hydrogen atom has been removed from a 4- to 6-membered lactone ring, such as a group in which one hydrogen atom has been removed from β-propionolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

Examples of the structural unit (a2$^L$) include structural units represented by the aforementioned general formula (a2-0) in which the R$^{28}$ group has been substituted with a lactone-containing cyclic group. Specific examples include structural units represented by general formulas (a2-1) to (a2-5) shown below.

[Chemical Formula 38]

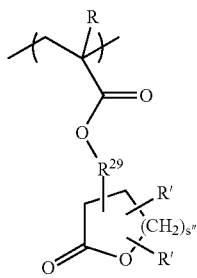
(a2-1)

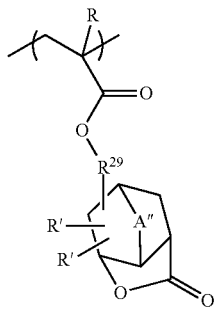
(a2-2)

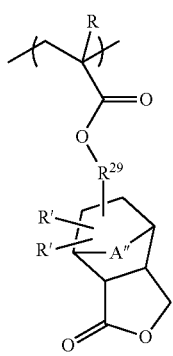
(a2-3)

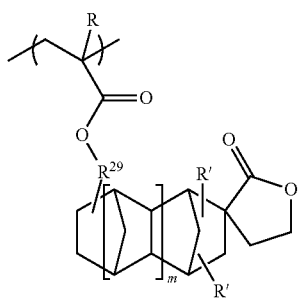
(a2-4)

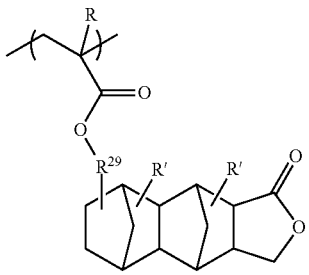
(a2-5)

In the formulas, R represents a hydrogen atom, an alkyl group of 1 to 5 carbon atoms or a halogenated alkyl group of 1 to 5 carbon atoms; each R' independently represents a hydrogen atom, an alkyl group of 1 to 5 carbon atoms, an alkoxy group of 1 to 5 carbon atoms or —COOR", wherein R" represents a hydrogen atom or an alkyl group; R$^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined above.

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group In terms of industrial availability, R' is preferably a hydrogen atom.

The alkyl group for R" may be any of linear, branched or cyclic.

When R" is a linear or branched alkyl group, it preferably has 1 to 10 carbon atoms, more preferably 1 to 5 carbon atoms.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As examples of A", the same groups as those described above for A' in general formula (3-1) can be given. A" is preferably an alkylene group of 1 to 5 carbon atoms, an oxygen atom (—O—) or a sulfur atom (—S—), and more preferably an alkylene group of 1 to 5 carbon atoms or —O—. As the alkylene group of 1 to 5 carbon atoms, a methylene group or a dimethylethylene group is preferable, and a methylene group is particularly desirable.

R$^{29}$ is the same as defined for R$^{29}$ in the aforementioned general formula (a2-0).

In formula (a2-1), s" is preferably 1 or 2.

Specific examples of structural units represented by general formulas (a2-1) to (a2-5) are shown below. In the formulas shown below, R$^\alpha$ represents a hydrogen atom, a methyl group or a trifluoromethyl group.
[Chemical Formula 39]
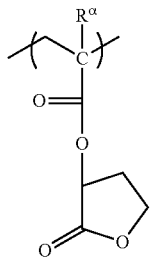
(a2-1-1)
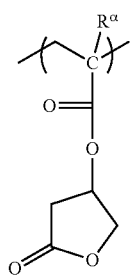
(a2-1-2)
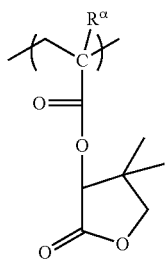
(a2-1-3)
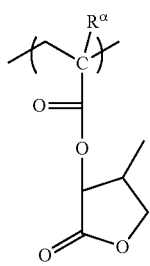
(a2-1-4)
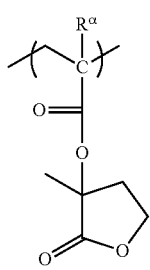
(a2-1-5)
-continued
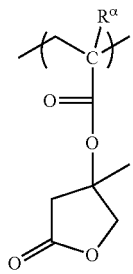
(a2-1-6)
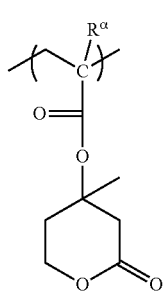
(a2-1-7)
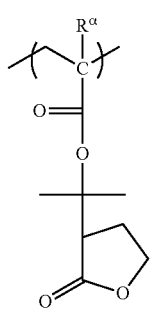
(a2-1-8)
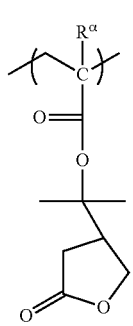
(a2-1-9)
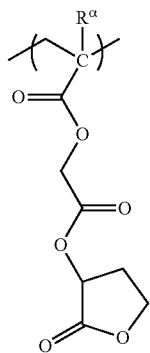
(a2-1-10)

(a2-1-11) 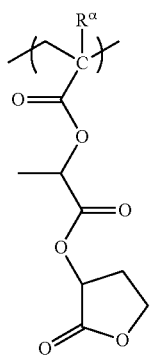
(a2-1-12) 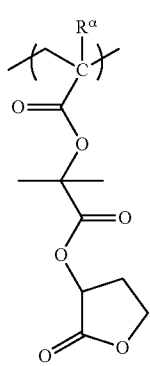
(a2-1-13) 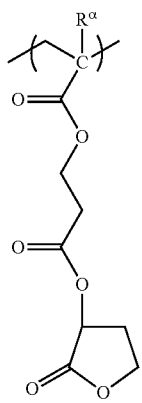
[Chemical Formula 40]
(a2-2-1) 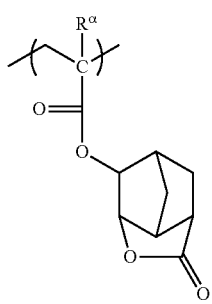
(a2-2-2) 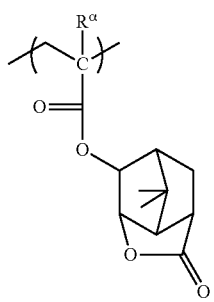
(a2-2-3) 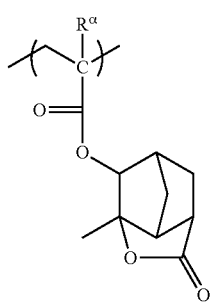
(a2-2-4) 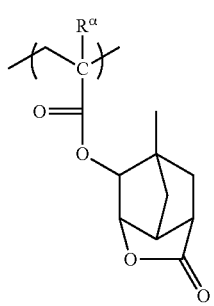
(a2-2-5) 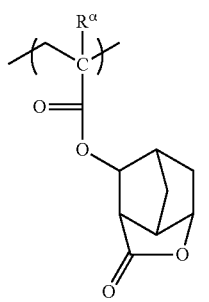
(a2-2-6) 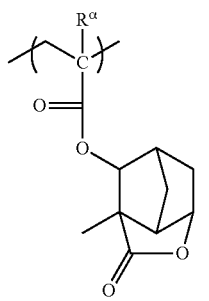

(a2-2-7) 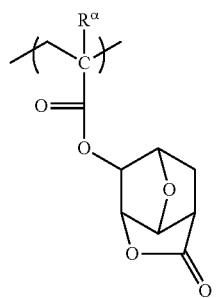
(a2-2-8) 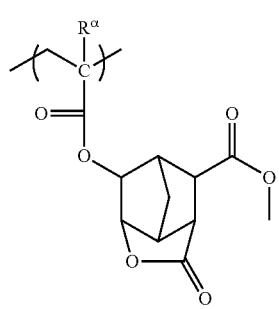
(a2-2-9) 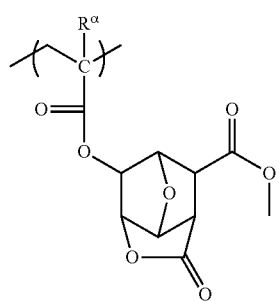
(a2-2-10) 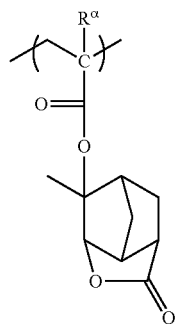
(a2-2-11) 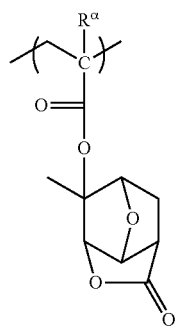
(a2-2-12) 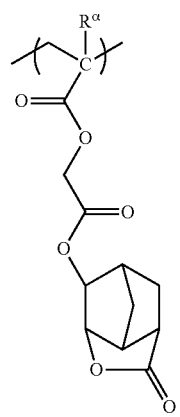
(a2-2-13) 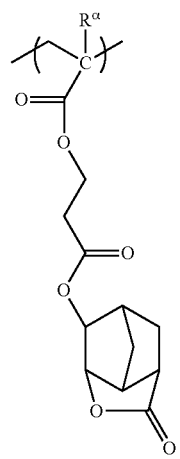
(a2-1-14) 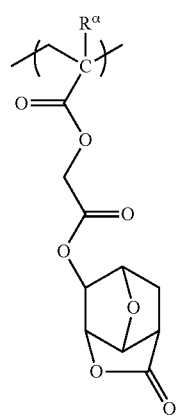

(a2-2-15)
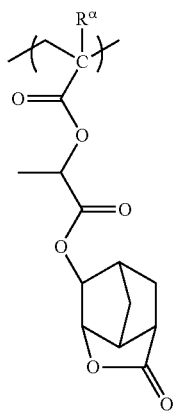
(a2-2-16)
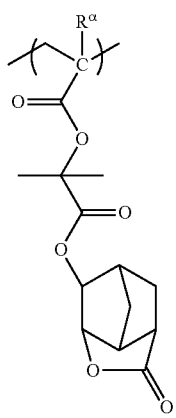
(a2-2-17)
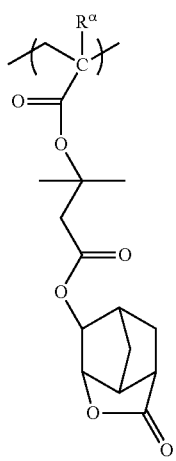
[Chemical Formula 41]
(a2-3-1)
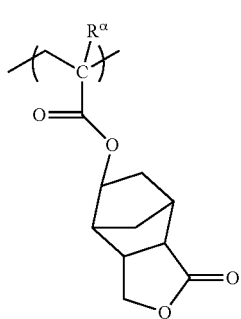
(a2-3-2)
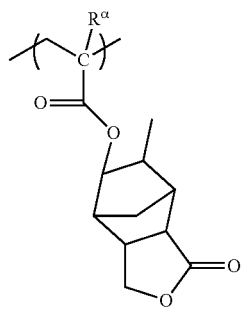
(a2-3-3)
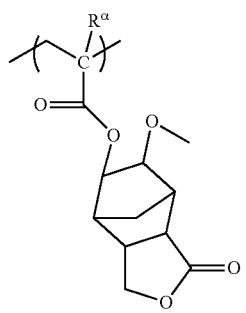
(a2-3-4)
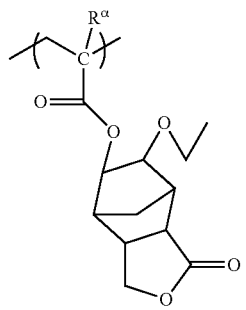
(a2-3-5)
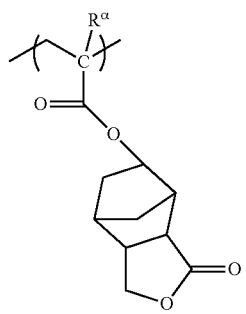
[Chemical Formula 42]
(a2-4-1)
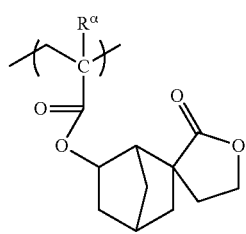

(a2-4-2)
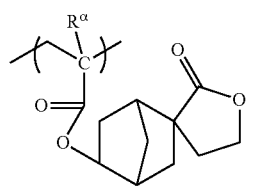
(a2-4-3)
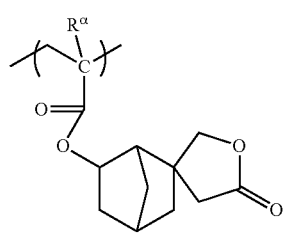
(a2-4-4)
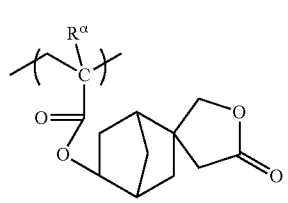
(a2-4-5)
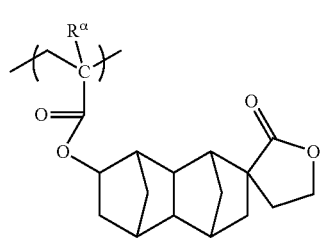
(a2-4-6)
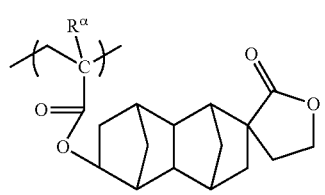
(a2-4-7)
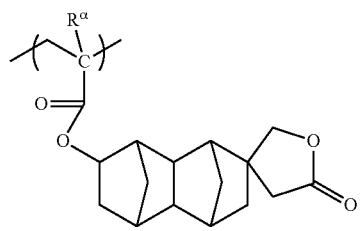
(a2-4-8)
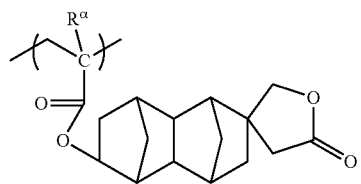
(a2-4-9)
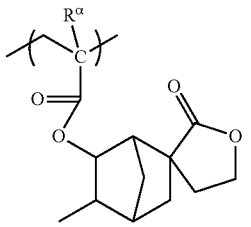
(a2-4-10)
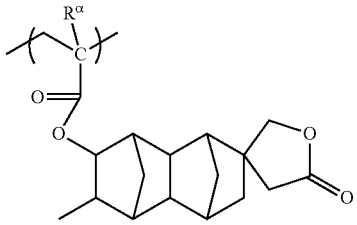
(a2-4-11)
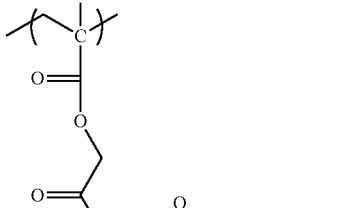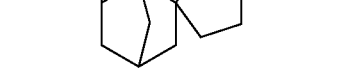
(a2-4-12)
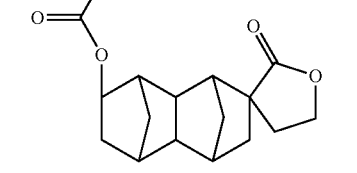
[Chemical Formula 43]
(a2-5-1)
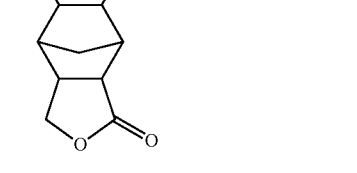

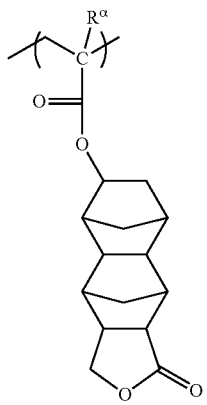

(a2-5-2)

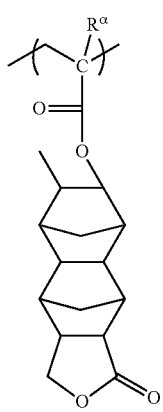

(a2-5-3)

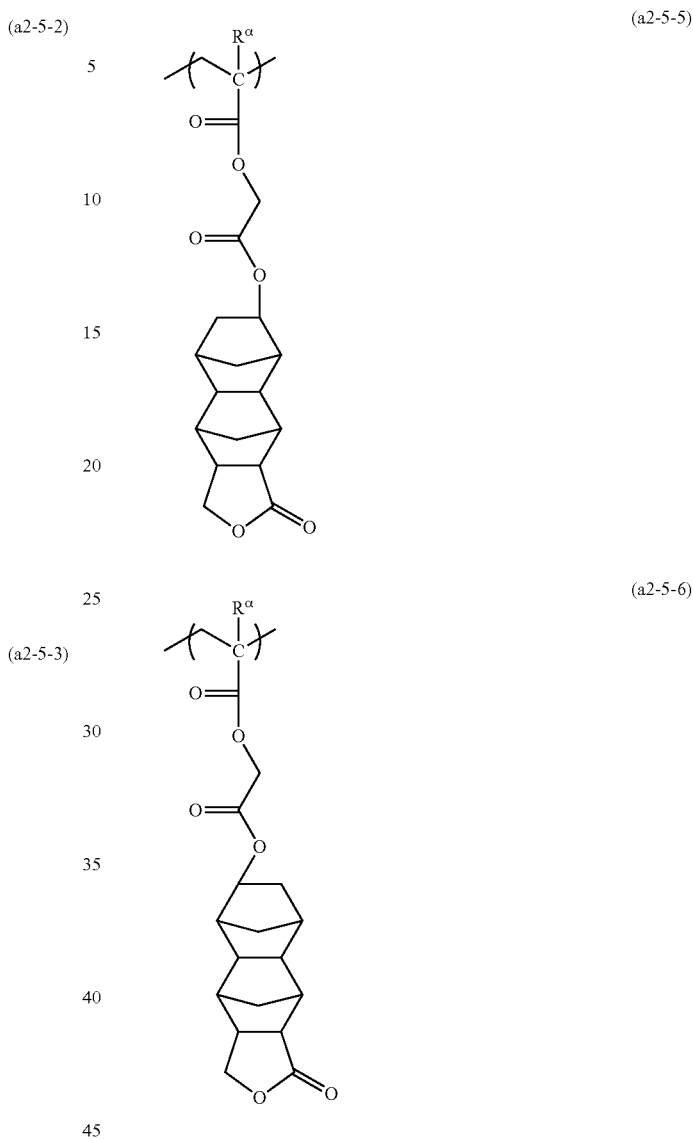

As the structural unit (a2$^L$), it is preferable to include at least one structural unit selected from the group consisting of structural units represented by the aforementioned general formulas (a2-1) to (a2-5), more preferably at least one structural unit selected from the group consisting of structural units represented by the aforementioned general formulas (a2-1) to (a2-3), and most preferably at least one structural unit selected from the group consisting of structural units represented by the aforementioned general formulas (a2-1) and (a2-3).

Specifically, it is preferable to use at least one structural unit selected from the group consisting of formulas (a2-1-1), (a2-1-2), (a2-2-1), (a2-2-7), (a2-2-12), (a2-2-14), (a2-3-1) and (a2-3-5).

In the component (A1), as the structural unit (a2), one type of structural unit may be used, or two or more types may be used in combination. For example, as the structural unit (a2), a structural unit (a2$^S$) may be used alone, or a structural unit (a2$^L$), or a combination of these structural units may be used.

Further, as the structural unit (a2$^S$) or the structural unit (a2$^L$), either a single type of structural unit may be used, or two or more types may be used in combination.

When the component (A1) contains the structural unit (a2), the amount of the structural unit (a2) based on the combined total of all structural units constituting the component (A1) is preferably 1 to 80 mol %, more preferably 10 to 75 mol %, still more preferably 10 to 70 mol %, and most preferably 15 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties such as DOF and CDU and pattern shape can be improved.

(Structural Unit (a3))

The structural unit (a3) is a structural unit derived from an acrylate ester which may have the hydrogen atom bonded to the carbon atom on the α-position substituted with a substituent and contains a polar group-containing aliphatic hydrocarbon group.

When the component (A1) includes the structural unit (a3), the hydrophilicity of the component (A1) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and polycyclic aliphatic hydrocarbon groups (polycyclic groups).

These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 44]

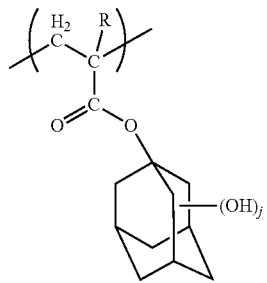
(a3-1)

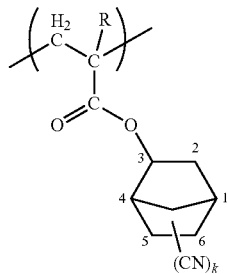
(a3-2)

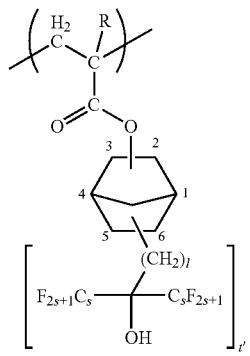
(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In general formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkylalcohol is preferably bonded to the 5th or 6th position of the norbornyl group.

As the structural unit (a3), one type of structural unit may be used, or two or more types may be used in combination.

In the component (A1), the amount of the structural unit (a3) based on the combined total of all structural units constituting the component (A1) is preferably 1 to 50 mol %, more preferably 3 to 45 mol %, and still more preferably 5 to 40 mol %. When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Other Structural Units)

The component (A1) may also have a structural unit other than the above-mentioned structural units (a1) to (a3) (hereafter, referred to as "structural unit (a4)"), as long as the effects of the present invention are not impaired.

As the structural unit (a4), any other structural unit which cannot be classified as one of the above structural units (a1) to (a3) can be used without any particular limitation, and any of the multitude of conventional structural units used within resist resins for ArF excimer lasers or KrF excimer lasers (and particularly for ArF excimer lasers) can be used.

Preferable examples of the structural unit (a4) include (1) a structural unit derived from an acrylate ester which contains a non-acid-dissociable aliphatic polycyclic group and may have the hydrogen atom bonded to the carbon atom on the α-position substituted with a substituent, (2) a structural unit derived from an acrylate ester which may have the hydrogen atom bonded to the carbon atom on the α-position substituted with a substituent, (3) a structural unit derived from a styrene monomer and/or a vinylnaphthalene monomer, and (4) a structural unit derived from a hydroxystyrene monomer and/or a vinyl(hydroxynaphthalene)monomer. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-6) shown below.

[Chemical Formula 45]

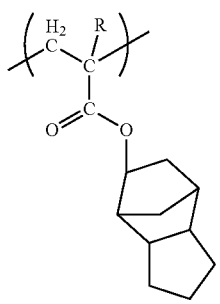
(a4-1)

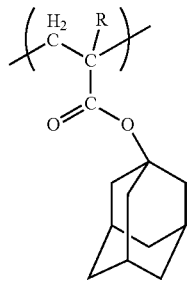
(a4-2)

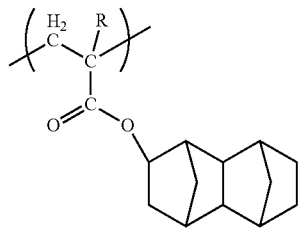
(a4-3)

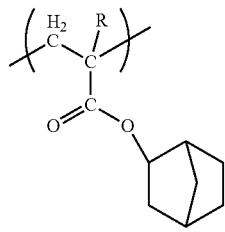
(a4-4)

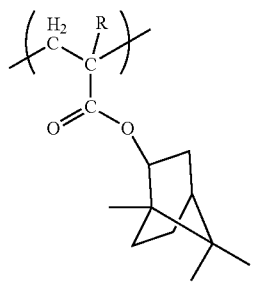
(a4-5)

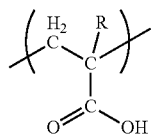
(a4-6)

In the formulas, R is the same as defined above.

As the structural unit (a4), one type of structural unit may be used, or two or more types may be used in combination.

When the component (A1) includes the structural unit (a4), the amount of the structural unit (a4) based on the combined total of all structural units constituting the component (A1) is preferably 1 to 20 mol %, more preferably 1 to 15 mol %, and still more preferably 1 to 10 mol %. When the amount of the structural unit (a4) is within the above-mentioned range, both obtaining excellent lithography properties and adjusting the dissolution rate can be achieved.

The component (A1) is a copolymer including the structural unit (a1).

Examples of such copolymers include a copolymer consisting of the structural units (a1) and (a2), a copolymer consisting of the structural units (a1) and (a3), and a copolymer consisting of the structural units (a1), (a2) and (a3).

In the present invention, as the component (A1), a copolymer that includes a combination of structural units represented by formula (A1-11) or (A1-12) shown below is particularly desirable. In general formulas shown below, R, $R^{29}$, s″, $R^{11}$, j, c, e, Z, e' and A' are the same as defined above, and the plurality of R may be the same or different.

[Chemical Formula 46]

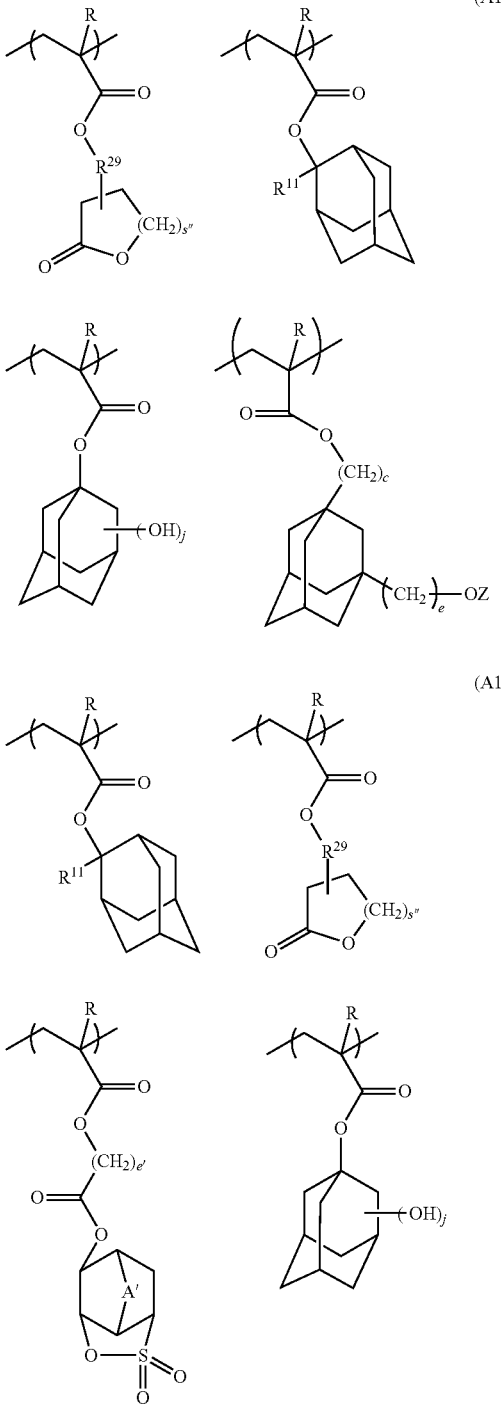

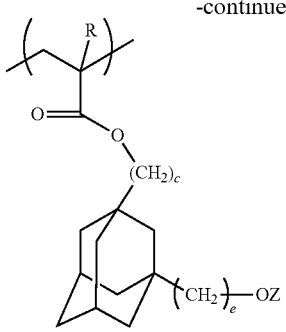

The weight average molecular weight (Mw) (the polystyrene equivalent value determined by gel permeation chromatography) of the component (A1) is not particularly limited, but is preferably 1,000 to 50,000, more preferably 1,500 to 30,000, still more preferably 2,500 to 20,000, still more preferably 6,000 to 15,000, and most preferably 7,000 to 12,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory. In addition, since the weight average molecular weight has relationship with the dissolution rate in a developing solution, when the weight average molecular weight is within the range of 6,000 to 15,000, the dissolution rate of the component (A1) can be appropriately adjusted.

Further, the dispersity (Mw/Mn) of the component (A1) is not particularly limited, but is preferably 1.0 to 5.0, more preferably 1.0 to 3.0, and most preferably 1.2 to 2.5.

Here, Mn is the number average molecular weight.

In the component (A), as the component (A1), one type may be used, or two or more types of compounds may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved.

[Component (A2)]

In the resist composition used in the present invention, the component (A) may contain "a base component which exhibits changed solubility in an alkali developing solution under action of acid" other than the component (A1) (hereafter, referred to as "component (A2)").

As the component (A2), it is preferable to use a compound that has a molecular weight of at least 500 and less than 2,500, contains a hydrophilic group, and also contains an acid dissociable group described above in connection with the component (A1).

Specific examples include compounds containing a plurality of phenol skeletons in which a part of the hydrogen atoms within hydroxyl groups have been substituted with the aforementioned acid dissociable groups.

Examples of the component (A2) include low molecular weight phenolic compounds in which a portion of the hydroxyl group hydrogen atoms have been substituted with an aforementioned acid dissociable group, and these types of compounds are known, for example, as sensitizers or heat resistance improvers for use in non-chemically amplified g-line or i-line resists.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples. In particular, a phenol compound having 2 to 6 triphenylmethane skeletons is preferable in terms of resolution and LWR.

Also, there are no particular limitations on the acid dissociable group, and suitable examples include the groups described above.

As the component (A2), one type of resin may be used, or two or more types of resins may be used in combination.

In the resist composition used in the present invention, as the component (A), one type may be used, or two or more types of compounds may be used in combination.

Of the examples shown above, as the component (A), it is preferable to use one containing the component (A1).

In the resist composition used in the present invention, the amount of the component (A) can be appropriately adjusted depending on the thickness of the resist film to be formed, and the like.

<Component (B)>

As the component (B), there is no particular limitation, and any of the known acid generators used in conventional chemically amplified resist compositions can be used. Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 47]

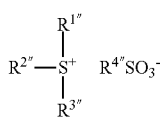

(b-1)

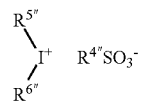

(b-2)

In the formulas above, $R^{1''}$ to $R^{3''}$, $R^{5''}$ and $R^{6''}$ each independently represent an aryl group or alkyl group, wherein two of $R^{1''}$ to $R^{3''}$ may be bonded to each other to form a ring with the sulfur atom; and $R^{4''}$ represents an alkyl group, a halogenated alkyl group, an aryl group or an alkenyl group which may have a substituent, provided that at least one of $R^{1''}$ to $R^{3''}$ represents an aryl group, and at least one of $R^{5''}$ and $R^{6''}$ represents an aryl group.

In formula (b-1) $R^{1''}$ to $R^{3''}$ each independently represents an aryl group or an alkyl group. In formula (b-1), two of $R^{1''}$ to $R^{3''}$ may be bonded to each other to form a ring with the sulfur atom.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

The alkyl group for $R^{1''}$ to $R^{3''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

When two of $R^{1''}$ to $R^{3''}$ in formula (b-1) are bonded to each other to form a ring with the sulfur atom, it is preferable that the two of $R^{1''}$ to $R^{3''}$ form a 3 to 10-membered ring including the sulfur atom, and it is particularly desirable that the two of $R^{1''}$ to $R^{3''}$ form a 5 to 7-membered ring including the sulfur atom.

When two of $R^{1''}$ to $R^{3''}$ in formula (b-1) are bonded to each other to form a ring with the sulfur atom, the remaining one of $R^{1''}$ to $R^{3''}$ is preferably an aryl group. As examples of the aryl group, the same as the above-mentioned aryl groups for $R^{1''}$ to $R^{3''}$ can be given.

As preferable examples of the cation moiety for the compound represented by general formula (b-1), those represented by formulas (I-1-1) to (I-1-11) shown below can be given. Among these, a cation moiety having a triphenylmethane skeleton, such as a cation moiety represented by any one of formulas (I-1-1) to (I-1-9) shown below is particularly desirable.

In formulas (I-1-10) and (I-1-11), each of $R^9$ and $R^{10}$ independently represents a phenyl group or naphthyl group which may have a substituent, an alkyl group of 1 to 5 carbon atoms, an alkoxy group or a hydroxy group.

u is an integer of 1 to 3, and most preferably 1 or 2.

[Chemical Formula 48]

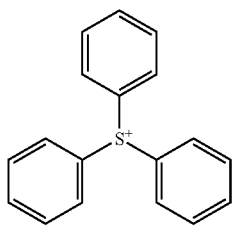
(I-1-1)

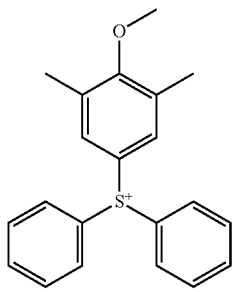
(I-1-2)

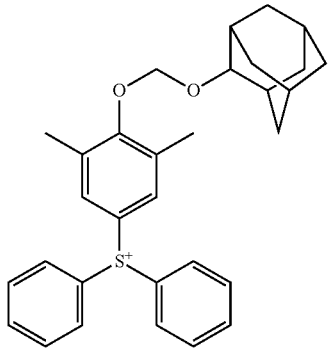
(I-1-3)

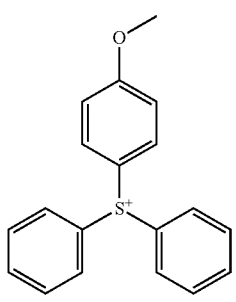
(I-1-4)

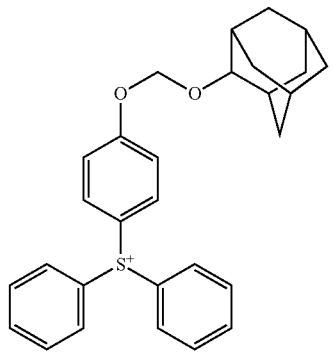
(I-1-5)

(I-1-6)

[Chemical Formula 49]

(I-1-7)

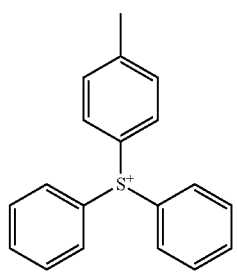
(I-1-8)

-continued

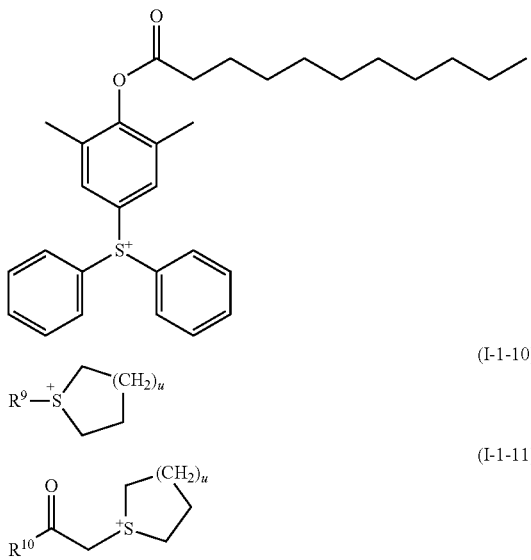

(I-1-9)

(I-1-10)

(I-1-11)

$R^{4'''}$ represents an alkyl group, a halogenated alkyl group, an aryl group or an alkenyl group which may have a substituent.

The alkyl group for $R^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4'''}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratio is preferable because the acid strength increases.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula $X$-$Q^1$- (in the formula, $Q^1$ represents a divalent linking group containing an oxygen atom; and X represents a hydrocarbon group of 3 to 30 carbon atoms which may have a substituent).

Examples of halogen atoms and alkyl groups as substituents for $R^{4'''}$ include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula X-$Q^1$-, $Q^1$ represents a divalent linking group containing an oxygen atom.

$Q^1$ may contain an atom other than oxygen. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)—, —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5, and most preferably 1 to 3.

Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2CH$($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2CH$($CH_3$)$CH_2CH_2$—; and a pentamethylene group [—$CH_2CH_2CH_2CH_2CH_2$—].

$Q^1$ is preferably a divalent linking group containing an ester linkage or ether linkage, and more preferably a group of —$R^{91}$—O—, —$R^{92}$—O—C(=O)— or —C(=O)—O—$R^{93}$—O—C(=O)—.

In the group represented by the formula X-$Q^1$-, the hydrocarbon group for X may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for X, there is no particular limitation as long as it is an atom other than carbon and hydrogen. Examples of hetero atoms include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L6) and (S1) to (S4) shown below.

[Chemical Formula 50]

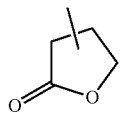
(L1)

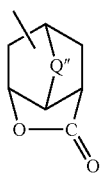
(L2)

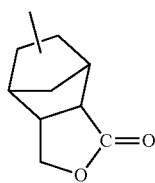
(L3)

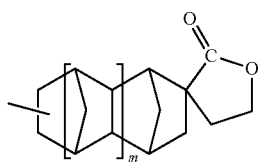
(L4)

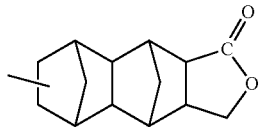
(L5)

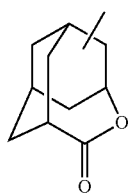
(L6)

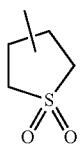
(S1)

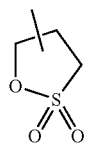
(S2)

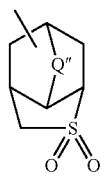
(S3)

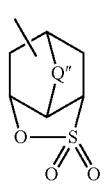
(S4)

In the formula, Q" represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents 0 or 1.

As the alkylene group for Q", R$^{94}$ and R$^{95}$, the same alkylene groups as those described above for R$^{91}$ to R$^{93}$ can be used.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

In the present invention, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by the aforementioned formulas (L2) to (L6), (S3) and (S4) are preferable.

In the present invention, R$^{4'''}$ preferably has X-Q$^1$- as a substituent. In such a case, R$^{4'''}$ is preferably a group represented by the formula X-Q$^1$-Y$^1$— (in the formula, Q$^1$ and X are the same as defined above; and Y$^1$ represents an alkylene group of 1 to 4 carbon atoms which may have a substituent, or a fluorinated alkylene group of 1 to 4 carbon atoms which may have a substituent).

In the group represented by the formula X-Q$^1$-Y$^1$—, as the alkylene group for Y$^1$, the same alkylene group as those described above for Q$^1$ in which the number of carbon atoms is 1 to 4 can be used.

As the fluorinated alkylene group, the aforementioned alkylene group in which part or all of the hydrogen atoms has been substituted with fluorine atoms can be used.

Specific examples of Y$^1$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—; —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

Y$^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$-, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), R$^{5\prime\prime\prime}$ and R$^{6\prime\prime\prime}$ each independently represent an aryl group or alkyl group. At least one of R$^{5\prime\prime\prime}$ and R$^{6\prime\prime\prime}$ represents an aryl group. It is preferable that both of R$^{5\prime\prime\prime}$ and R$^{6\prime\prime\prime}$ represent an aryl group.

As the aryl group for R$^{5\prime\prime\prime}$ and R$^{6\prime\prime\prime}$, the same aryl groups as those described above for R$^{1\prime\prime\prime}$ to R$^{3\prime\prime\prime}$ can be used.

As the alkyl group for R$^{5\prime\prime\prime}$ and R$^{6\prime\prime\prime}$, the same alkyl groups as those described above for R$^{1\prime\prime\prime}$ to R$^{3\prime\prime\prime}$ can be used.

It is particularly desirable that both of R$^{5\prime\prime\prime}$ and R$^{6\prime\prime\prime}$ represents a phenyl group.

As R$^{4\prime\prime\prime}$ in formula (b-2), the same groups as those mentioned above for R$^{4\prime\prime\prime}$ in formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate, such as methanesulfonate, n-propanesulfonate, n-butanesulfonate, n-octanesulfonate, 1-adamantanesulfonate, 2-norbornanesulfonate or d-camphor-10-sulfonate; or replaced by an aromatic sulfonate, such as benzenesulfonate, perfluorobenzenesulfonate or p-toluenesulfonate.

Furthermore, onium salts in which the anion moiety of these onium salts are replaced by an anion moiety represented by any one of formulas (b1) to (b8) shown below can be used.

[Chemical Formula 51]

(b1)

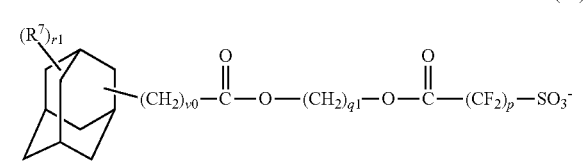

[Chemical Formula - (b2)]

$$H_{2g+1}C_g-\overset{O}{\underset{\parallel}{C}}-O-(CH_2)_{q2}-O-\overset{O}{\underset{\parallel}{C}}-(CF_2)_p-SO_3^-$$

(b3)

$$(R^7)_{r2}-\text{adamantyl}-\overset{O}{\underset{\parallel}{C}}-O-(CH_2)_{q3}-(CF_2)_{t3}-SO_3^-$$

(b4)

$$(R^7)_{w1}-Q''-(CH_2)_{v1}-O-\left[\overset{O}{\underset{\parallel}{C}}\right]_{n1}-(CF_2)_p-SO_3^-$$
(with lactone C=O group)

(b5)

$$(R^7)_{w2}-Q''-(CH_2)_{v2}-O-\left[\overset{O}{\underset{\parallel}{C}}\right]_{n2}-(CF_2)_p-SO_3^-$$
(with sultone O=S=O group)

(b6)

$$(R^7)_{w3}-Q''-(CH_2)_{v3}-O-\left[\overset{O}{\underset{\parallel}{C}}\right]_{n3}-(CF_2)_p-SO_3^-$$

(b7)

$$(R^7)_{w4}-\text{naphthyl}-(CH_2)_{v4}-O-\left[\overset{O}{\underset{\parallel}{C}}\right]_{n4}-(CF_2)_p-SO_3^-$$

(b8)

$$(R^7)_{w5}-\text{phenyl}-(CH_2)_{v5}-O-\left[\overset{O}{\underset{\parallel}{C}}\right]_{n5}-(CF_2)_p-SO_3^-$$

In the formulas, p represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; g represents an integer of 1 to 20; $R^7$ represents a substituent; each of n1 to n5 independently represents 0 or 1; each of v0 to v5 independently represents an integer of 0 to 3; each of w1 to w5 independently represents an integer of 0 to 3; and Q'' is the same as defined above.

As the substituent for $R^7$, the same groups as those which the aforementioned aliphatic hydrocarbon group or aromatic hydrocarbon group for X may have as a substituent can be used.

If there are two or more of the $R^7$ group, as indicated by the values r1, r2, and w1 to w5, then the two or more of the $R^7$ groups may be the same or different from each other.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 52]

(b-3)

$$\begin{array}{c} SO_2 \\ -N \\ SO_2 \end{array} X''$$

(b-4)

$$\begin{array}{c} O_2S-Y'' \\ -N \\ O_2S-Z'' \end{array}$$

In the formulas, X'' represents an alkylene group of 2 to 6 carbon atoms in which at least one hydrogen atom has been substituted with a fluorine atom; and each of Y'' and Z'' independently represents an alkyl group of 1 to 10 carbon atoms in which at least one hydrogen atom has been substituted with a fluorine atom.

X'' represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y'' and Z'' independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X'' or those of the alkyl group for Y'' and Z'' within the above-mentioned range of the number of carbon atoms, the more the solubility in a resist solvent is improved.

Further, in the alkylene group for X'' or the alkyl group for Y'' and Z'', it is preferable that the number of hydrogen atoms substituted with fluorine atoms is as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

[Chemical Formula 53]

(b-5)

[Structure showing dibenzothiophenium cation with phenyl substituent bearing $(R^{41})_{n_1}$, and $(R^{42})_{n_2}$ and $(R^{43})_{n_3}$ on the dibenzothiophene rings]

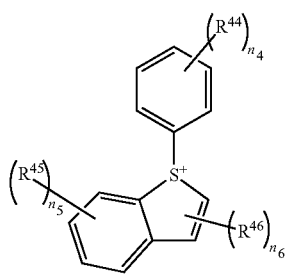

(b-6)

In formulas (b-5) and (b-6) above, each of $R^{41}$ to $R^{46}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert-butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4"}SO_3^-$) for onium salt-based acid generators represented by general formula (b-1) or (b-2) shown above; and anion moieties represented by general formula (b-3) or (b-4) shown above.

In the present description, an oximesulfonate-based acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 54]

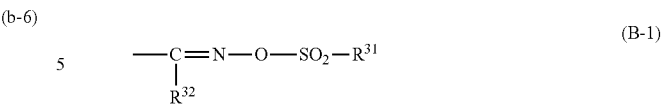

(B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 55]

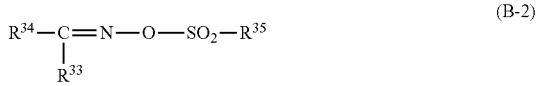

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 56]

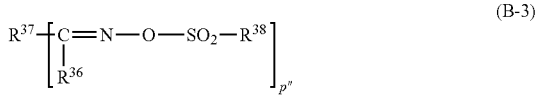

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 86) may be preferably used.

Furthermore, as preferable examples, the following can be used.

[Chemical Formula 57]

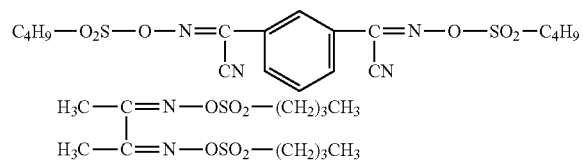

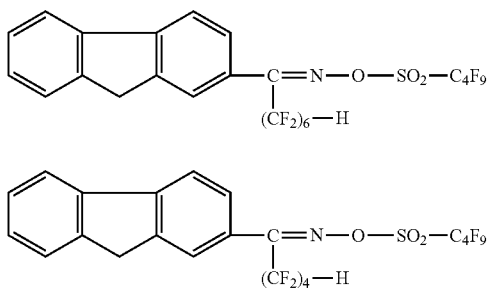

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of acid generator may be used, or two or more types of acid generators may be used in combination.

In the present invention, as the component (B), it is preferable to use at least an onium salt acid generator having a fluorinated alkylsulfonate ion as an anion moiety, and it is more preferable to use a combination of an onium salt acid generator having an anion represented by any of the aforementioned formulas (b1) to (b8) and an onium salt acid generator having an anion represented by the aforementioned formula (b-3).

In the resist composition used in the present invention, the amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Components>
[Component (D)]

It is preferable that the resist composition used in the present invention further includes a nitrogen-containing organic compound (D) (hereafter referred to as the component (D)) as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used. Among these, an aliphatic amine, particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine and triethanolamine triacetate, and triethanolamine triacetate is preferable.

Further, as the component (D), an aromatic amine may be used.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonylpyrrolidine.

As the component (D), one type of compound may be used alone, or two or more types may be used in combination.

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

<Component (E)>

Furthermore, in the resist composition, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added as an optional component.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferred, and salicylic acid is particularly desirable.

In the present invention, when the resist composition contains the component (E), the amount of the component (E) is used in an amount within a range from 0.01 to 5.0 parts by weight, relative to 100 parts by weight of the component (A).

<Component (F)>

The resist composition may further include a fluorine additive (hereafter, referred to as "component (F)") for imparting water repellency to the resist film. As the component (F), for example, a fluorine-containing polymeric compound described in Japanese Unexamined Patent Application, First Publication No. 2010-002870.

Specific examples of the component (F) include copolymers having a structural unit represented by formula (f1) shown below. The component (F) is preferably a polymer (homopolymer) consisting of a structural unit represented by formula (f1) shown below; a copolymer of a structural unit represented by formula (f1) shown below and the aforementioned structural unit (a1); or a copolymer of a structural unit represented by formula (f1) shown below, a structural unit derived from acrylic acid or methacrylic acid and the aforementioned structural unit (a1). As the structural unit (a1) to be copolymerized with a structural unit represented by formula (f1) shown below, a structural unit represented by the aforementioned formula (a1-5) is preferable, and a structural unit represented by the aforementioned formula (a11-1-1) is particularly desirable.

[Chemical Formula 58]

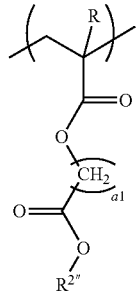

(f1)

In the formula, R is the same as defined above; a1 represents an integer of 1 to 5; and $R^{2'''}$ represents an organic group containing a fluorine atom.

In formula (f1), R is the same as defined above. As R, a hydrogen atom or a methyl group is preferable.

In formula (f1), a1 represents an integer of 1 to 5, preferably an integer of 1 to 3, and more preferably 1 or 2.

In formula (f1), $R^{2'''}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $R^{2'''}$, a fluorinated hydrocarbon group of 1 to 5 carbon atoms is preferable, and a methyl group, —$CH_2$—$CF_3$, —$CH_2$—$CF_2$—$CF_3$, —$CH(CF_3)_2$, —$CH_2$—$CH_2$—$CF_3$, and —$CH_2$—$CH_2$—$CF_2$—$CF_2$—$CF_2$—$CF_3$ are most preferable.

As the component (F), one type may be used alone, or two or more types may be used in combination.

The component (F) is typically used in an amount within a range from 1 to 10 parts by weight, relative to 100 parts by weight of the component (A).

If desired, other miscible additives can also be added to the resist composition. Examples of such miscible additives include additive resins for improving the performance of the resist film, surfactants for improving the applicability, dissolution inhibitors, plasticizers, stabilizers, colorants, halation prevention agents, and dyes.

If desired, other miscible additives can also be added to the resist composition. Examples of such miscible additives include additive resins for improving the performance of the resist film, surfactants for improving the applicability, dissolution inhibitors, plasticizers, stabilizers, colorants, halation prevention agents, and dyes.

<Component (S)>

The resist composition can be produced by dissolving the materials for the resist composition in an organic solvent (hereafter, referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples of the component (S) include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

The component (S) can be used individually, or in combination as a mixed solvent.

Among these, γ-butyrolactone, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

Furthermore, as the component (S), a mixed solvent of PGMEA and cyclohexanone is also preferable. The mixing ratio of such a mixed solvent is preferably PGMEA:cyclohexanone=95 to 5:10 to 90.

According to the present invention, miniaturization of the pattern dimension can be achieved, and the uniformity of the pattern can be improved.

As described above, in general, with respect to a resist pattern using a negative tone development resist composition, when narrowing down of the intervals between patterns (e.g., the diameter of hole in a contact hole pattern, the space width in the case of a space (trench) pattern) is attempted by heat shrinking, the intervals between the patterns are rather increased. The reason for this is that, in a resist film formed using a general negative tone development resist composition, the pattern portions have a gap generated inside thereof as result of elimination of groups, so that the pattern portions shrink toward the gaps.

On the other hand, by the method of forming a resist pattern according to the present invention, a thermal treatment is conducted after covering the resist pattern formed using a negative tone development resist composition with a coating film of a coating material. As a result, the coating film itself can be subjected to heat shrinking, and it is presumed that the side walls of the pattern portions of the resist film can be pulled toward the space between the patterns, thereby obtaining the above effects.

EXAMPLES

As follows is a description of examples of the present invention, although the scope of the present invention is by no way limited by these examples.

Examples 1 to 3

Comparative Example 1

The components shown in Table 1 were mixed together to obtain negative tone development resist compositions.

TABLE 1

| | Component (A) | Component (B) | | Component (F) | Component (S) |
|---|---|---|---|---|---|
| Ex. 1 | (A)-1 | (B)-1 | (B)-2 | (F)-1 | (S)-1/(S)-2 |
| Comp. Ex. 1 | [100] | [6.5] | [4.2] | [4.0] | [2500/280] |
| Ex. 2 | (A)-2 | (B)-3 | (B)-2 | (F)-1 | (S)-1/(S)-2 |
| | [100] | [20] | [4.2] | [4.0] | [2500/280] |

In Table 1, the reference characters indicate the following. Further, the values in brackets [ ] indicate the amount (in terms of parts by weight) of the component added.

(A)-1: polymeric compound (A)-1 shown below [Mw=8,000, Mw/Mn=1.56, l/m/n/o=45/35/10/10 (molar ratio)]

(A)-2: polymeric compound (A)-2 shown below [Mw=8,000, Mw/Mn=1.57, l/m/n/o/p=45/30/9/8/8 (molar ratio)]

(B)-1: compound (B)-1 shown below (B)-2: compound (B)-2 shown below (B)-3: compound (B)-3 shown below (F)-1: polymeric compound (F)-1 shown below [Mw=25,000, Mw/Mn=1.61, l/m=30/70 (molar ratio)]

(S)-1: propyleneglycol monomethyletheracetate (S)-2: cyclohexanone

[Chemical Formula 59]

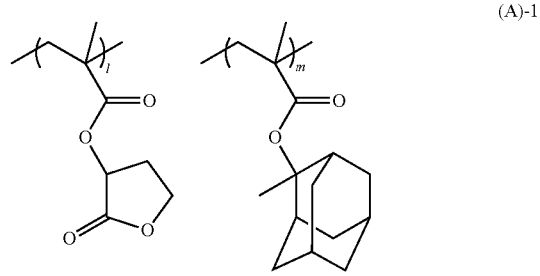

(A)-1

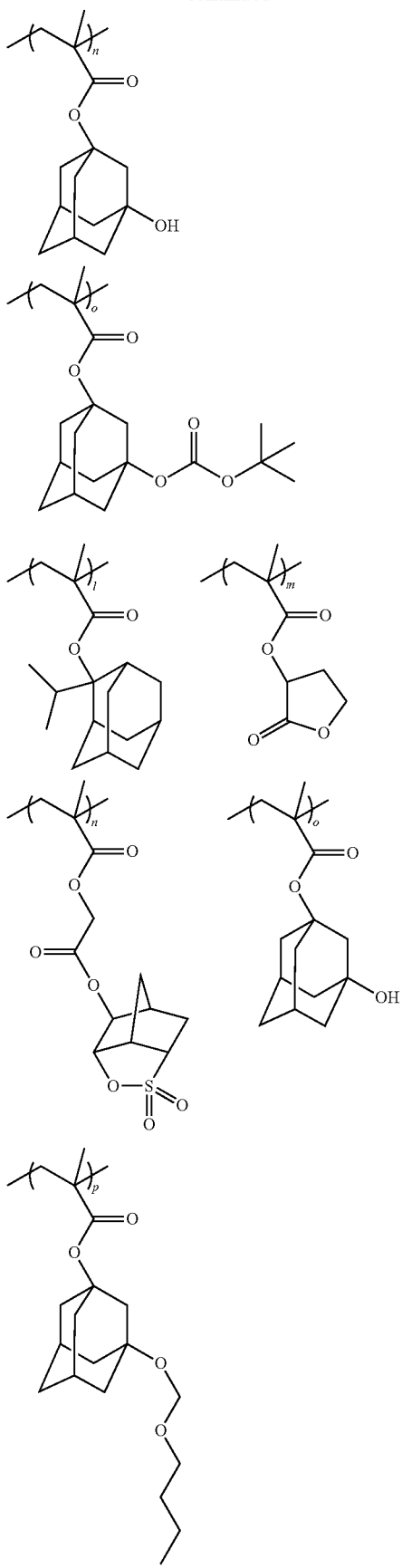
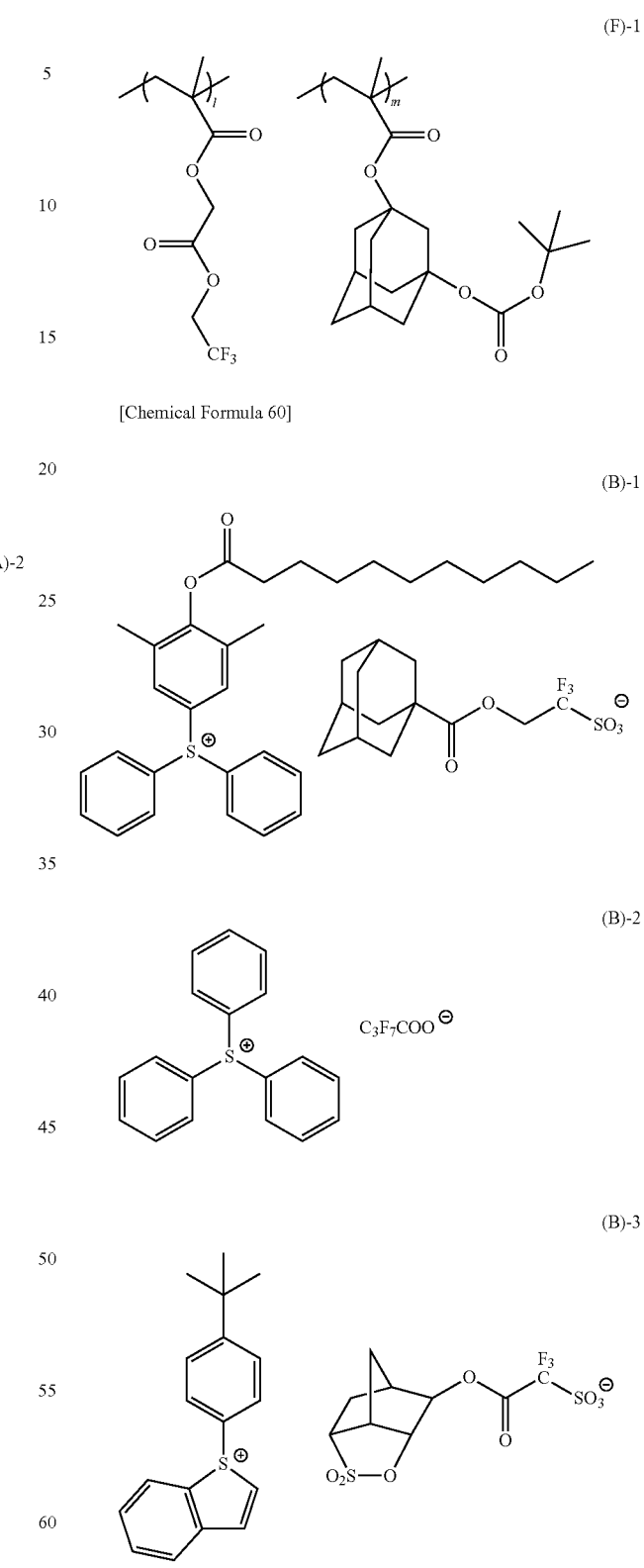
Using the obtained negative tone development resist compositions, resist patterns were formed in the following manner.

Formation of Resist Pattern 1

Examples 1 and 2, Comparative Example 1

An organic anti-reflection film composition (product name: ARC95, manufactured by Brewer Science Ltd.) was applied to an 12-inch silicon wafer using a spinner, and the composition was then baked at 205° C. for 60 seconds, thereby forming an organic anti-reflection film having a film thickness of 90 nm.

Then, the resist composition of each example was applied to the organic anti-reflection film using a spinner, and was then prebaked (PAB) on a hotplate at 105° C. for 60 seconds and dried, thereby forming a resist film having a film thickness of 100 nm.

Subsequently, the resist film was selectively irradiated with an ArF excimer laser (193 nm) through a mask, using an ArF exposure apparatus NSR-S60913 (manufactured by Nikon Corporation, NA (numerical aperture)=1.07, Crosspole (0.78/0.97) w/POLANO).

Next, PEB was conducted at 110° C. for 60 seconds, and development treatment was performed at 23° C. for 13 seconds using butyl acetate, followed by drying by shaking. As a result, a contact hole pattern (CH pattern) in which holes having a diameter of 50 nm were equally spaced (pitch: 100 nm) was formed. The optimum exposure dose Eop was 26 mJ/cm$^2$.

Subsequently, to each of the CH patterns obtained in Examples 1 and 2, a coating material containing a copolymer of acrylic acid and vinylpyrrolidone (acrylic acid:vinylpyrrolidone=2:1 (weight ratio)), triethylamine, a surfactant and water and exhibiting a pH of 3 was applied using a spinner, thereby forming a coating film having a thickness of 200 nm as measured from the substrate.

On the other hand, a coating film was not formed on the CH pattern of Comparative Example 1.

Thereafter, the CH pattern on the substrate was subjected to a thermal treatment at a temperature of 100° C. (reference), 140° C., 150° C., 155° C. or 160° C., followed by removing the coating film at 23° C. using pure water.

The sizes (hole diameters) of the CH pattern after being subjected to the thermal treatment at each temperature are shown in Table 2.

Further, with respect to the CH pattern subjected to the thermal treatment at each temperature, the diameters of 200 holes were measured. From the results, the value of 3 times the standard deviation was calculated as a yardstick of CDU (CD uniformity; pattern uniformity). The smaller the value is, the better the CDU. The results are shown in Table 2.

Formation of Resist Pattern 2

Example 3

Evaluations were performed in the same manner as in Example 1, except that the pH of the coating material used was adjusted to 7 (the amount of triethylamine was adjusted). The results are shown in Table 2.

TABLE 2

|  |  | 100° C. (Ref.) | 140° C. | 150° C. | 155° C. | 160° C. |
| --- | --- | --- | --- | --- | --- | --- |
| Ex. 1 | Hole diameter (nm) | 50.0 | 46.4 | 45.0 | 45.3 | 42.6 |
|  | CDU | 8.4 | 7.4 | 7.5 | 6.9 | 7.4 |
| Ex. 2 | Hole diameter (nm) | 50.1 | 48.5 | 46.8 | 46.2 | 45.2 |
|  | CDU | 7.8 | 7.3 | 7.2 | 6.8 | 6.7 |
| Ex. 3 | Hole diameter (nm) | 50.0 | 47.5 | 46.9 | 46.8 | 46.6 |
|  | CDU | 8.4 | 8.0 | 7.8 | 7.5 | 7.4 |
| Comp. Ex. 1 | Hole diameter (nm) | 50.0 | 51.0 | 51.8 | — | 52.4 |
|  | CDU | 8.4 | 7.9 | 10.4 | — | 7.6 |

From the results shown above, the resist patterns formed by the method of Examples 1 to 3 had a small pattern size and exhibited excellent pattern uniformity, as compared to the resist pattern formed by the method of Comparative Example 1.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a resist pattern, comprising:
   a step of forming a resist film on a substrate using a resist composition comprising a base component (A) which exhibits decreased solubility in an organic solvent under action of acid and an acid-generator component (B) which generates acid upon exposure;
   a step of subjecting the resist film to exposure;
   a step of patterning the resist film by a negative-tone development using a developing solution containing the organic solvent to form a resist pattern;
   a step of applying a coating material to the resist pattern, thereby forming a coating film;
   a step of performing a thermal treatment at a temperature lower than the softening point of the resist pattern, thereby heat shrinking the coating film to narrow an interval between the resist pattern; and
   a step of removing the coating film, wherein
   the pH of the coating material is 1 to 5.

2. The method according to claim 1, wherein the coating material comprises an aqueous polymer.

3. The method according to claim 2, wherein the aqueous polymer comprises at least one member selected from the group consisting of alkylene glycol polymers, cellulosic derivatives, vinyl polymers, acrylic polymers, urea polymers, epoxy polymers, melamine polymers and nylon polymers.

4. The method according to claim 1, wherein the coating material further comprises an aqueous amine.

* * * * *

UNITED STATES PATENT AND TRADEMARK OFFICE
CERTIFICATE OF CORRECTION

PATENT NO.         : 8,865,395 B2
APPLICATION NO.    : 13/489862
DATED              : October 21, 2014
INVENTOR(S)        : Tsuyoshi Nakamura and Kiyoshi Ishikawa It is certified that error appears in the above-identified patent and that said Letters Patent is hereby corrected as shown below:

In the Specification

At Column 6, Line 46, Change "at" to --as--.

At Column 7, Line 63, Change "ehtyl" to --ethyl--.

At Column 8, Line 64, Change "perfluoronpetane;" to --perfluoropentane;--.

At Column 10, Line 44, Change "Shinakita" to --Shin-Akita--.

At Column 10, Line 46, Change "F 173," to --F173,--.

At Column 10, Line 55, Change "(telomer" to --(telomere--.

At Column 11, Line 18, Change "C6F 13" to --C6F13--.

At Column 13, Line 66, Change "doner," to --donor,--.

At Column 54, Line 32, Change "(a-1-1-4)," to --(a1-1-4),--.

At Column 55, Line 16, After "atoms;" insert --$R^{11}$--.

At Column 61, Line 28, Change "(a1))" to --(a1)--.

At Column 62, Line 44, After "(=O)," insert -- —COOR",--.

At Column 66, Line 15, Change "$(CH_2)_1$" to --$(CH_2)_f$--.

At Column 69, Line 67, Change "genera" to --general--.

Signed and Sealed this
Twenty-third Day of June, 2015

Michelle K. Lee
*Director of the United States Patent and Trademark Office*

At Column 71, Line 7, Change "(a2$^5$),"  to --(a2$^S$),--.
At Column 72, Line 66, Change "(β-propionolatone," to --β-propiolactone,--.
At Column 74, Line 33, Change "group" to --group.--.
At Column 94, Line 16, Change "(b-1)" to --(b-1),--.
At Column 100, Line 30, Change "henicosyl" to --heneicosyl--.
At Column 115, Line 63, Change "as result" to --as a result--.
At Column 118 (Structure), 53-59 (Approx.),
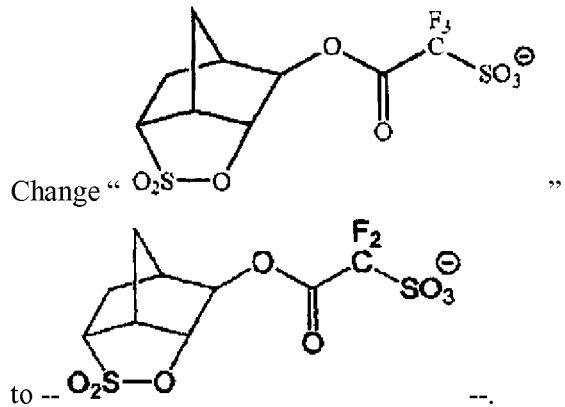
At Column 119, Line 19, Change "NSR-S60913" to --NSR-S609B--.